US012520594B2

(12) United States Patent
Yuan et al.

(10) Patent No.: US 12,520,594 B2
(45) Date of Patent: Jan. 6, 2026

(54) DISPLAY SUBSTRATE, MAINTENANCE METHOD AND DISPLAY DEVICE

(71) Applicants: HEFEI BOE JOINT TECHNOLOGY CO., LTD., Anhui (CN); BOE TECHNOLOGY GROUP CO., LTD., Beijing (CN)

(72) Inventors: Can Yuan, Beijing (CN); Luke Ding, Beijing (CN); Zhidong Yuan, Beijing (CN); Liu Wu, Beijing (CN); Yongqian Li, Beijing (CN); Dacheng Zhang, Beijing (CN); Cheng Xu, Beijing (CN); Dandan Zhou, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 33 days.

(21) Appl. No.: 18/557,810

(22) PCT Filed: Jul. 28, 2022

(86) PCT No.: PCT/CN2022/108510
§ 371 (c)(1),
(2) Date: Oct. 27, 2023

(87) PCT Pub. No.: WO2024/020921
PCT Pub. Date: Feb. 1, 2024

(65) Prior Publication Data
US 2025/0089365 A1 Mar. 13, 2025

(51) Int. Cl.
*H10D 86/60* (2025.01)
*G09G 3/00* (2006.01)
(Continued)

(52) U.S. Cl.
CPC ............ *H10D 86/60* (2025.01); *G09G 3/006* (2013.01); *G09G 3/3225* (2013.01);
(Continued)

(58) Field of Classification Search
CPC ...... H10D 86/60; H10D 86/443; G09G 3/006; G09G 3/3225; G09G 2300/0819;
(Continued)

(56) References Cited

U.S. PATENT DOCUMENTS

2014/0313107 A1 10/2014 Lee
2016/0313620 A1 * 10/2016 Dai ...................... H10D 86/441
(Continued)

FOREIGN PATENT DOCUMENTS

CN 104299583 A * 1/2015
CN 108122952 A 6/2018
(Continued)

*Primary Examiner* — Hang Lin
(74) *Attorney, Agent, or Firm* — BROOKS KUSHMAN P.C.

(57) ABSTRACT

A display substrate including a base substrate and a driving module arranged on the base substrate, the driving module includes at least one driving unit, and the driving unit includes N stages of driving circuits; N is a positive integer, n is a positive integer less than or equal to N; the nth stage of driving circuit includes a (2n−1)th stage of output circuit, a 2nth stage of output circuit and a first node control circuit; the first node is electrically connected to the (2n−1)th stage of output circuit and the 2nth stage of output circuit respectively through a first connection line; the driving module also includes a scanning line; there are at least two mutually independent overlapping portions between the orthographic projection of the first connection line on the base substrate and the orthographic projection of the scanning line on the base substrate.

19 Claims, 25 Drawing Sheets

(51) Int. Cl.
*G09G 3/3225* (2016.01)
*H10D 86/40* (2025.01)

(52) U.S. Cl.
CPC ... *H10D 86/443* (2025.01); *G09G 2300/0819* (2013.01); *G09G 2300/0842* (2013.01); *G09G 2310/0286* (2013.01); *G09G 2310/08* (2013.01); *G09G 2330/12* (2013.01)

(58) Field of Classification Search
CPC ... G09G 2300/0842; G09G 2310/0283; G09G 2310/08; G09G 2330/12; G09G 3/3266; G09G 3/3676–3677; G09G 2310/0267
See application file for complete search history.

(56) References Cited

U.S. PATENT DOCUMENTS

| | | | |
|---|---|---|---|
| 2018/0151661 | A1 | 5/2018 | Oh et al. |
| 2019/0164498 | A1* | 5/2019 | Jang ..................... G09G 3/3266 |
| 2021/0312869 | A1 | 10/2021 | Dai et al. |
| 2021/0366425 | A1 | 11/2021 | Zhang et al. |
| 2022/0189405 | A1 | 6/2022 | Bai et al. |
| 2023/0247872 | A1 | 8/2023 | Feng et al. |

FOREIGN PATENT DOCUMENTS

| | | | |
|---|---|---|---|
| CN | 109859678 | A | 6/2019 |
| CN | 110068970 | A | 7/2019 |
| CN | 113140607 | A | 7/2021 |
| CN | 114299878 | A | 4/2022 |
| CN | 114299884 | A | 4/2022 |
| CN | 114446260 | A | 5/2022 |
| JP | 2010072397 | A | 4/2010 |
| KR | 20200081071 | A | 7/2020 |

* cited by examiner

DISPLAY SUBSTRATE, MAINTENANCE METHOD AND DISPLAY DEVICE

CROSS-REFERENCE TO RELATED APPLICATION

This application is the U.S. national phase of PCT Application No. PCT/CN2022/108510 filed on Jul. 28, 2022, which is incorporated herein by reference in its entirety.

TECHNICAL FIELD

The present disclosure relates to the field of display technology, in particular to a display substrate, a maintenance method and a display device.

BACKGROUND

In a related display substrate, the driving module includes a plurality of driving units, and the driving unit may include a plurality of stages of driving circuit, and the driving circuit may be a driving circuit with a Pulse Width Modulation (PWM) function. The driving circuit adopts the structure sharing the first node and the second node, and the driving circuit controls to provide corresponding scanning signals through two stages of driving output terminals through one first node and one second node, which is beneficial to realize narrow borders. However, the scanning line connected to the driving output terminal of the driving circuit away from the display area needs to cross the connection line in the driving circuit close to the display area. If a short circuit occurs when crossing the line, the two driving circuits will fail, and eventually lead to dark lines, and a low display product yield.

SUMMARY

In one aspect, the present disclosure provides in some embodiments a display substrate, including: a base substrate and a driving module arranged on the base substrate, wherein the driving module includes at least one driving unit, and the driving unit includes N stages of driving circuits; N is a positive integer, n is a positive integer less than or equal to N; an nth stage of driving circuit includes a (2n−1)th stage of output circuit, a 2nth stage of output circuit and a first node control circuit; the first node control circuit is electrically connected to a first node and is configured to control a potential of the first node; the (2n−1)th stage of output circuit is electrically connected to the first node and a (2n−1)th stage of driving output terminal, and is configured to control the (2n−1)th stage of driving output terminal to provide a (2n−1)th stage of scanning signal under the control of the potential of the first node; the 2nth stage of output circuit is electrically connected to the first node and a 2nth stage of driving output terminal respectively, and is configured to control the 2nth stage of driving output terminal to provide a 2nd stage of scanning signal under the control of the potential of the first node; the first node is electrically connected to the (2n−1)th stage of output circuit and the 2nth stage of output circuit respectively through a first connection line; the driving module further includes a scanning line; there are at least two mutually independent overlapping portions between an orthographic projection of the first connection line on the base substrate and an orthographic projection of the scanning line on the base substrate.

Optionally, the nth stage of driving circuit further includes a second node control circuit; the second node control circuit is electrically connected to a second node and is configured to control a potential of the second node; the (2n−1)th stage of output circuit is also electrically connected to the second node, and is also configured to control the (2n−1)th stage of driving output terminal to provide the (2n−1)th stage of scanning signal under the control of the potential of the second node; the 2nth stage of output circuit is also electrically connected to the second node, and is further configured to control the 2nth stage of driving output terminal to provide the 2nth stage of scanning signal under the control of the potential of the second node; the second node is electrically connected to the (2n−1)th stage of output circuit and the 2nth stage of output circuit through a second connection line; there are at least two mutually independent overlapping portions between an orthographic projection of the second connection line on the base substrate and the orthographic projection of the scanning line on the base substrate.

Optionally, the first connection line includes a first connection line part, a first conducting line, a second conducting line and a second connection line part; the first node is electrically connected to the (2n−1)th stage of output circuit through the first connection line part, and the first connection line part is respectively electrically connected to the first conducting line and the second conducting line, and the first conducting line and the second conducting line are electrically connected to the 2nth stage of driving circuit through the second connection line part respectively; there is a first overlapping portion between the orthographic projection of the scanning line on the base substrate and an orthographic projection of the first conducting line on the base substrate, there is a second overlapping portion between the orthographic projection of the scanning line on the base substrate and an orthographic projection of the second conducting line on the base substrate; the first overlapping portion and the second overlapping portion are independent of each other.

Optionally, a line width of the first conducting line is greater than or equal to 5 um and less than or equal to 10 um, and a line width of the second conducting line is greater than or equal to 5 um and less than or equal to 10 um; a distance between the first conducting line and the second conducting line is greater than or equal to 6 um and less than or equal to 8 um.

Optionally, the second connection line includes a third connection line part, a third conducting line, a fourth conducting line and a fourth connection line part; the second node is electrically connected to the 2nth stage of output circuit through the third connection line part, and the third connection line part is respectively electrically connected to the third conducting line and the fourth conducting line, and the third conducting line and the fourth conducting line are respectively electrically connected to the (2n−1)th stage of driving circuit through the fourth connection line part; there is a third overlapping portion between the orthographic projection of the scanning line on the base substrate and an orthographic projection of the third conducting line on the base substrate, there is a fourth overlapping portion between the orthographic projection of the scanning line on the base substrate and an orthographic projection of the fourth conducting line on the base substrate; the third overlapping portion and the fourth overlapping portion are independent of each other.

Optionally, a line width of the third conducting line is greater than or equal to 5 um and less than or equal to 10 um, and a line width of the fourth conducting line is greater than or equal to 5 um and less than or equal to 10 um; a distance between the third conducting line and the fourth conducting line is greater than or equal to 6 um and less than or equal to 8 um.

Optionally, the scanning line includes a first scanning connection line, a first scanning line part, a second scanning line part, and a second scanning connection line; the first scanning connection line is electrically connected to the second scanning connection line through the first scanning line part and the second scanning line part; there is a fifth overlapping portion between the orthographic projection of the first connection line on the base substrate and an orthographic projection of the first scanning line part on the base substrate, there is a sixth overlapping portion between the orthographic projection of the first connection line on the base substrate and an orthographic projection of the second scanning line part on the base substrate; the fifth overlapping portion and the sixth overlapping portion are independent of each other.

Optionally, a line width of the first scanning line part is greater than or equal to 5 um and less than or equal to 10 um, and a line width of the second scanning line part is greater than or equal to 5 um and less than or equal to 10 um, a distance between the first scanning line part and the second scanning line part is greater than or equal to 6 um and less than or equal to 8 um.

Optionally, the scanning line include a third scanning connection line, a third scanning line part, a fourth scanning line part and a fourth scanning connection line; the third scanning connection line is electrically connected to the fourth scanning connection line through the third scanning line part and the fourth scanning line part, and there is a seventh overlapping portion between the orthographic projection of the second connection line on the base substrate and an orthographic projection of the third scanning line part on the base substrate, there is an eighth overlapping portion between the orthographic projection of the second connection line on the base substrate and an orthographic projection of the fourth scanning line part on the base substrate; the seventh overlapping portion and the eighth overlapping portion are independent of each other.

Optionally, a line width of the third scanning line part is greater than or equal to 5 um and less than or equal to 10 um, and a line width of the fourth scanning line part is greater than or equal to 5 um and less than or equal to 10 um, a distance between the third scanning line part and the fourth scanning line part is greater than or equal to 6 um and less than or equal to 8 um.

Optionally, the driving module includes a shift register, a first driving unit, a second driving unit, a first scanning line, a second scanning line, and a shift scanning line; the first driving unit is electrically connected to the first scanning line and is configured to provide a first scanning signal for the first scanning line; the second driving unit is electrically connected to the second scanning line and is configured to provide a second scanning signal for the second scanning line; the shift register is electrically connected to the shift scanning line and is configured to provide a shift scanning signal for the shift scanning line; the shift register, the first driving unit and the second driving unit are arranged in sequence along a direction close to a display area.

Optionally, the first driving unit includes a plurality of stages of first driving circuit; an nth stage of first driving circuit includes a (2n−1)th stage of first output circuit, a 2nth stage of first output circuit, a first first node control circuit and a first second node control circuit; the first first node control circuit is electrically connected to a first first node, and is configured to control a potential of the first first node; the first second node control circuit is electrically connected to a first second node and is configured to control a potential of the first second node; the (2n−1)th stage of first output circuit is electrically connected to the first first node, the first second node, and a (2n−1)th stage of first driving output terminal respectively, is configured to control the (2n−1)th stage of first driving output terminal to provide a (2n−1)th stage of first scanning signal under the control of the potential of the first first node and the potential of the first second node; the 2nth stage of first output circuit is electrically connected to the first first node, the first second node, and the 2nth stage of first driving output terminal, respectively, is configured to control the 2nth stage of first driving output terminal to provide the 2nth stage of first scanning signal under the control of the potential of the first first node and the potential of the first second node; the driving module further includes a first scanning line of a (2n−1)th row and a first scanning line of a 2nth row; the (2n−1)th stage of first driving output terminal is electrically connected to the first scanning line of the (2n−1)th row, the 2nth stage of the first driving output terminal is electrically connected to the first scanning line of the 2nth row; the first first node is respectively electrically connected to the (2n−1)th stage of first output circuit and the 2nth stage of first output circuit through a first first connection line; the first second node is respectively electrically connected to the (2n−1)th stage of first output circuit and the 2nth stage of first output circuit through the first second connection line; there are at least two mutually independent overlapping portions between an orthographic projection of the first first connection line on the base substrate and an orthographic projection of the shift scanning line on the base substrate, there are at least two mutually independent overlapping portions between an orthographic projection of the first second connection line on the base substrate and the orthographic projection of the shift scanning line on the base substrate.

Optionally, the second driving unit includes a plurality of stages of second driving circuits; an nth stage of second driving circuit includes a (2n−1)th stage of second output circuit, a 2nth stage of second output circuit, a second first node control circuit and a second second node control circuit; the second first node control circuit is electrically connected to the second first node, and is configured to control the potential of the second first node; the second second node control circuit is electrically connected to the second second node, and is configured to control the potential of the second second node; the (2n−1)th stage of second output circuit is electrically connected to the second first node, the second second node, and the (2n−1)th stage of second driving output terminal respectively, is configured to control the (2n−1)th stage of second driving output terminal to provide a (2n−1)th stage of second scanning signal under the control of the potential of the second first node and the potential of the second second node; the 2nth stage of second output circuit is electrically connected to the second first node, the second second node, and the 2nth stage of second driving output terminal, is configured to control the 2nth stage of second driving output terminal to provide a 2nth stage of second scanning signal under the control of the potential of the second first node and the potential of the second second node; the driving module also includes a second scanning line of the (2n−1)th row and a second scanning line of the 2nth row; the (2n−1)th stage of second driving output terminal is electrically connected to the second scanning line of the (2n−1)th row, the 2nth stage of second driving output terminal is electrically connected to the second scanning line of the 2nth row; the second first node is electrically connected to the (2n−1)th stage of second output circuit and the 2nth stage of second output circuit respectively through a second first connection line; the second second node is respectively electrically connected to the (2n−1)th stage of second output circuit and the 2nth stage of second output circuit through a second second connection line; there are at least two mutually independent overlapping portions between an orthographic projection of the second first connection line on the base substrate and the orthographic projection of the shift scanning line on the base substrate, there are at least two mutually independent overlapping portions between the orthographic projection of the second second connection line on the base substrate and the orthographic projection of the shift scanning line on the base substrate.

Optionally, there are at least two mutually independent overlapping portions between the orthographic projection of the second first connection line on the base substrate and the orthographic projection of the first scanning line of the (2n−1)th row on the base substrate; there are at least two mutually independent overlapping portions between the orthographic projection of the second second connection line on the base substrate and the orthographic projection of the first scanning line of the (2n−1)th row on the base substrate; or, there are at least two mutually independent overlapping portions between the orthographic projection of the second first connection line on the base substrate and the orthographic projection of the first scanning line of the 2nth row on the base substrate; there are at least two mutually independent overlapping portions between the orthographic projection of the second second connection line on the base substrate and the orthographic projection of the first scanning line of the 2nth row on the base substrate.

Optionally, the driving module further comprises a third scanning line and a third driving unit; the third driving unit is electrically connected to the third scanning line and is configured to provide a third scanning signal for the third scanning line; the third driving unit is arranged on a side of the second driving unit close to the display area.

Optionally, the third driving unit includes a plurality of stages of third driving circuits; the nth stage of third driving circuit includes a (2n−1)th stage of third output circuit, a 2nth stage of third output circuit, a third first node control circuit and a third second node control circuit; the third first node control circuit is electrically connected to a third first node, and is configured to control a potential of the third first node; the third second node control circuit is electrically connected to a third second node, and is configured to control a potential of the third second node; the (2n−1)th stage of third output circuit is electrically connected to the third first node, the third second node and the (2n−1)th stage of third driving output terminal respectively, is configured to control the (2n−1)th stage of third driving output terminal to provide a (2n−1)th stage of third scanning signal under the control of the potential of the third first node and the potential of the third second node; the 2nth stage of third output circuit is electrically connected to the third first node, the third second node, and the 2nth stage of third driving output terminal, and is configured to control the 2nth stage of third driving output terminal to provide a 2nth stage of third scanning signal under the control of the potential of the third first node and the potential of the third second node; the driving module further includes a third scanning line of the (2n−1)th row and a third scanning line of the 2nth row; the (2n−1)th stage of the third driving output terminal is electrically connected to the third scanning line of the (2n−1)th row, the 2nth stage of third driving output terminal is electrically connected to the third scanning line of the 2nth row; the third first node is respectively electrically connected to the (2n−1)th stage of third output circuit and the 2nth stage of third output circuit through a third first connection line; the third second node is respectively electrically connected to the (2n−1)th stage of third output circuit and the 2nth stage of third output circuit through a third second connection line; there are at least two mutually independent overlapping portions between an orthographic projection of the third first connection line on the base substrate and the orthographic projection of the shift scanning line on the base substrate, there are at least two mutually independent overlapping portions between an orthographic projection of the third second connection line on the base substrate and the orthographic projection of the shift scanning line on the base substrate.

Optionally, there are at least two mutually independent overlapping portions between the orthographic projection of the third first connection line on the base substrate and the orthographic projection of the first scanning line of (2n−1)th row on the base substrate; there are at least two mutually independent overlapping portions between the orthographic projection of the third second connection line on the base substrate and the orthographic projection of the first scanning line of (2n−1)th row on the base substrate; there are at least two mutually independent overlapping portions between the orthographic projection of the third first connection line on the base substrate and the orthographic projection of the second scanning line of (2n−1)th row on the base substrate; there are at least two mutually independent overlapping portions between the orthographic projection of the third second connection line on the base substrate and the orthographic projection of the second scanning line of the (2n−1)th row on the base substrate; or, there are at least two mutually independent overlapping portions between the orthographic projection of the third first connection line on the base substrate and the orthographic projection of the first scanning line of the 2nth row on the base substrate; there are at least two mutually independent overlapping portions between the orthographic projection of the third second connection line on the base substrate and the orthographic projection of the first scanning line of the 2nth row on the base substrate; there are at least two mutually independent overlapping portions between the orthographic projection of the third first connection line on the base substrate and the orthographic projection of the second scanning line of the 2nth row on the base substrate; there are at least two mutually independent overlapping portions between the orthographic projection of the third second connection line on the base substrate and the orthographic projection of the second scanning line of the 2nth row on the base substrate.

Optionally, the display substrate further includes a first gate metal layer and a first source-drain metal layer arranged in sequence on the base substrate; the scanning line included in the driving module is arranged on the first gate metal layer; the first connection line includes a first conducting line and a second conducting line, and the second connection line includes a third conducting line and a fourth conducting line; the first conducting line, the second conducting line, the third conducting line and the fourth conducting line are all arranged on the first source-drain metal layer.

Optionally, the display substrate further includes a first gate metal layer, a first source-drain metal layer, and a second source-drain metal layer arranged in sequence on the base substrate; the scanning line included in the driving module is arranged on the first gate metal layer; the first connection line includes a first conducting line and a second conducting line, and the second connection line includes a third conducting line and a fourth conducting line; the first conducting line, the second conducting line, the third conducting line and the fourth conducting line are all arranged on the second source-drain metal layer.

Optionally, the display substrate further includes a first gate metal layer, a first source-drain metal layer, and a second source-drain metal layer arranged in sequence on the base substrate; the first conducting line is arranged on the first source-drain metal layer, the second conducting line is arranged on the second source-drain metal layer; or the first conducting line is arranged on the second source-drain metal layer, the second conducting line is arranged on the first source-drain metal layer.

Optionally, the display substrate further includes a first gate metal layer, a first source-drain metal layer, and a second source-drain metal layer arranged in sequence on the base substrate; the third conducting line is arranged on the first source-drain metal layer, the fourth conducting line is arranged on the second source-drain metal layer; or the third conducting line is arranged on the second source-drain metal layer, the fourth conducting line is arranged on the first source-drain metal layer.

In a second aspect, an embodiment of the present disclosure provides a maintenance method of a display substrate, applied to the display substrate, wherein the maintenance method includes: performing a screen-on test on the display substrate, and controlling each row of pixel circuits to display an image; when there is an abnormal display of the pixel circuit, detecting, by a line detector, whether there is a short circuit between a scanning line of a corresponding row and a first connection line; when the line detector detects the short circuit between the scanning line of the corresponding row and the first connection line, cutting off the scanning line of the corresponding row or the first connection line, so that the scanning line of the corresponding row is disconnected from the first connection line, and the scanning line of the corresponding row provides a scanning signal of the corresponding row to the corresponding row of pixel circuits, and the first connection line is electrically connected to the (2n−1)th stage of output circuit and the 2nth stage of output circuit.

Optionally, the nth stage of driving circuit further includes a second node control circuit; the (2n−1)th stage of output circuit is also electrically connected to the second node; the second node is electrically connected to the (2n−1)th stage of output circuit and the 2nth stage of output circuit through the second connection line; there are at least two independent overlapping portions between the orthographic projection of the second connection line on the base substrate and the orthographic projection of the scanning line on the base substrate; the maintenance method of the display substrate further includes: when there is an abnormal display of the pixel circuit, detecting, by the line detector, whether there is a short circuit between the scanning line of the corresponding row and the second connection line; when the line detector detects the short circuit between the scanning line of the corresponding row and the second connection line, cutting off the scanning line of the corresponding row or the second connection line, so that the scanning line of the corresponding row is disconnected from the second connection line, and the scanning line of the corresponding row provides a scanning signal of the corresponding row to the corresponding row of pixel circuits, and the second connection line is electrically connected to the (2n−1)th stage of output circuit and the 2nth stage of output circuit.

In a third aspect, an embodiment of the present disclosure provides a display device including the display substrate.

BRIEF DESCRIPTION OF THE DRAWINGS

In FIG. 14 and FIG. 15, the one labeled GL0 (2n−1) is the shift scanning line in the (2n−1)th row; the one labeled GL1 (2n−1) is the first scanning line in the (2n−1)th row;

FIG. 15 is a layout diagram of the first gate metal layer in FIG. 14;

DETAILED DESCRIPTION

Figure 1:
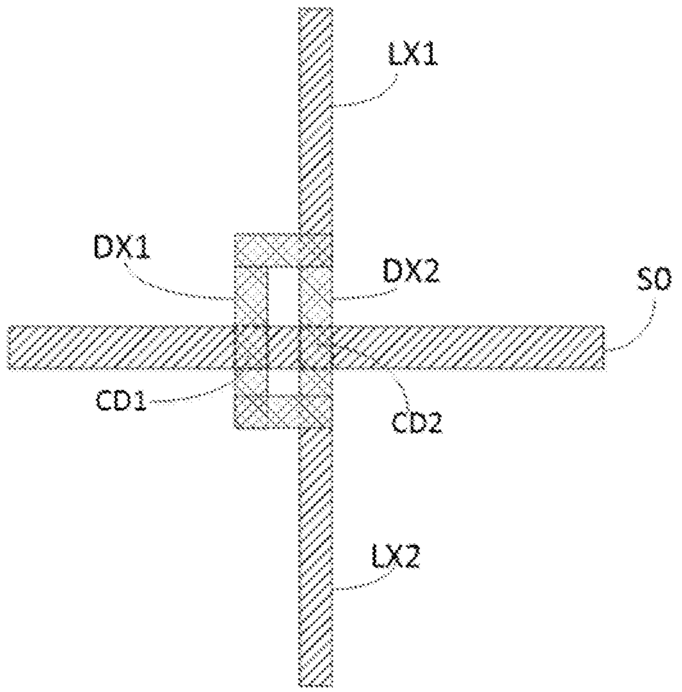
FIG. 1 shows a schematic diagram of a first overlapping portion CD1 between the orthographic projection of the first conducting line DX1 on the base substrate and the orthographic projection of the scanning line S0 on the base substrate and a second overlapping portion CD2 between the orthographic projection of the second conducting line DX2 on the base substrate and the orthographic projection of the scanning line S0 on the base substrate according to at least one embodiment of the present disclosure.

The following will clearly and completely describe the technical solutions in the embodiments of the present disclosure with reference to the accompanying drawings in the embodiments of the present disclosure. Obviously, the described embodiments are only some of the embodiments of the present disclosure, not all of them. Based on the embodiments in the present disclosure, all other embodiments obtained by those ordinary skilled in the art without creative work belong to the protection scope of the present disclosure.

The transistors used in all the embodiments of the present disclosure may be triodes, thin film transistors or field effect transistors or other devices with the same characteristics. In the embodiments of the present disclosure, in order to distinguish the two electrodes of the transistor except the control electrode, one electrode is called the first electrode, and the other electrode is called the second electrode.

In actual operation, when the transistor is a triode, the control electrode can be a base, the first electrode can be a collector, and the second electrode can be an emitter; or, the control electrode can be a base, the first electrode may be an emitter, and the second electrode may be a collector.

In actual operation, when the transistor is a thin film transistor or a field effect transistor, the control electrode may be a gate electrode, the first electrode may be a drain electrode, and the second electrode may be a source electrode; or, the control electrode may be a gate electrode, the first electrode may be a source electrode, and the second electrode may be a drain electrode.

The display substrate described in the embodiment of the present disclosure includes a base substrate and a driving module arranged on the base substrate, the driving module includes at least one driving unit, and the driving unit includes N stages of driving circuits; N is a positive integer, n is a positive integer less than or equal to N;

The nth stage of driving circuit includes a (2n−1)th stage of output circuit, a 2nth stage of output circuit and a first node control circuit;

The first node control circuit is electrically connected to the first node and is configured to control the potential of the first node;

The (2n−1)th stage of output circuit is electrically connected to the first node and the (2n−1)th stage of driving output terminal, and is configured to control the (2n−1)th stage of driving output terminal to provide the (2n−1)th stage of scanning signal;

The 2nth stage of output circuit is electrically connected to the first node and the 2nth stage of driving output terminal respectively, and is configured to control the 2nth stage of driving output terminal to provide the 2nd stage of scanning signal under the control of the potential of the first node;

The first node is electrically connected to the (2n−1)th stage of output circuit and the 2nth stage of output circuit respectively through a first connection line;

The driving module also includes a scanning line;

There are at least two mutually independent overlapping portions between the orthographic projection of the first connection line on the base substrate and the orthographic projection of the scanning line on the base substrate.

In at least one embodiment of the present disclosure, there are at least two mutually independent overlapping portions between the orthographic projection of the first connection line on the base substrate and the orthographic projection of the scanning line on the base substrate refers to: there are at least two overlapping portions between the orthographic projection of the first connection line on the base substrate and the orthographic projection of the scanning line on the base substrate, and the at least two overlapping portions are not mutually connected.

In the embodiment of the present disclosure, the (2n−1)th stage of output circuit and the 2nth stage of output circuit share a first node, and the first node is electrically connected to the (2n−1)th stage of output circuit and the 2nth stage of output circuit through a first connection line, there are at least two mutually independent overlapping portions between the orthographic projection of the first connection line on the base substrate and the orthographic projection of the scanning line on the base substrate, so that when a short circuit occurs between the first connection line and the scanning line, the short circuit path can be cut off after positioning to ensure that the driving module can still work normally.

In at least one embodiment of the present disclosure, the nth stage of driving circuit further includes a second node control circuit;

The second node control circuit is electrically connected to the second node and is configured to control the potential of the second node;

The (2n−1)th stage of output circuit is also electrically connected to the second node, and is also configured to control the (2n−1)th stage of driving output terminal to provide the 2nth stage of scanning signal under the control of the potential of the second node;

The 2nth stage of output circuit is also electrically connected to the second node, and is further configured to control the 2nth stage of driving output terminal to provide the 2nth stage of scanning signal under the control of the potential of the second node;

The second node is electrically connected to the (2n−1)th stage of output circuit and the 2nth stage of output circuit through a second connection line; there are at least two mutually independent overlapping portions between the orthographic projection of the second connection line on the base substrate and the orthographic projection of the scanning line on the base substrate.

In at least one embodiment of the present disclosure, there are at least two mutually independent overlapping portions between the orthographic projection of the second connection line on the base substrate and the orthographic projection of the scanning line on the base substrate refers to: there are at least two overlapping portions between the orthographic projection of the second connection line on the base substrate and the orthographic projection of the scanning line on the base substrate, and the at least two overlapping portions do not contact each other.

In at least one embodiment of the present disclosure, the (2n−1)th stage of output circuit and the 2nth stage of output circuit share a second node, and the second node is connected to the (2n−1)th stage of output circuit and the 2nth stage of output circuit through the second connection line, and there are at least two mutually independent overlapping portions between the orthographic projection of the second connection line on the base substrate and the orthographic projection of the scanning line on the base substrate, so that when a short circuit occurs between the second connection line and the scanning line, the short circuit path can be cut off after positioning to ensure that the driving module can still work normally.

In at least one embodiment of the present disclosure, the first connection line may include a first connection line part, a first conducting line, a second conducting line and a second connection line part;

The first node is electrically connected to the (2n−1)th stage of output circuit through a first connection line part, and the first connection line part is respectively electrically connected to the first conducting line and the second conducting line, and the first conducting line and the second conducting line are electrically connected to the 2nth stage of driving circuit through the second connection line parts;

There is a first overlapping portion between the orthographic projection of the scanning line on the base substrate and the orthographic projection of the first conducting line on the base substrate, there is a second overlapping portion between the orthographic projection of the scanning line on the base substrate and the orthographic projection of the second conducting line on the base substrate;

The first overlapping portion and the second overlapping portion are independent of each other.

In specific implementation, the first connection line may include a first connection line part, a first conducting line, a second conducting line and a second connection line part, and the first connection line part is electrically connected to the second connection line part through the first conducting line and the second conducting line respectively. There is a first overlapping portion between the orthographic projection of the scanning line on the base substrate and the orthographic projection of the first conducting line on the base substrate, there is a second overlapping portion between the orthographic projection of the scanning line on the base substrate and the orthographic projection of the second conducting line on the base substrate, the first overlapping portion and the second overlapping portion are independent of each other, so that when there is a short circuit between the scanning line and the first conducting line, the first conducting line can be cut off by laser, so as to ensure that the driving module works normally while eliminating the short circuit defect, when there is a short circuit defect between the scanning line and the second conducting line, the second conducting line can be cut off by laser, and maintenance can be performed, and the short circuit defect can be eliminated while ensuring the normal operation of the driving module, so that the display product yield can achieve an excellent effect.

In at least one embodiment of the present disclosure, the line width of the first conducting line is greater than or equal to 5 um and less than or equal to 10 um, and the line width of the second conducting line is greater than or equal to 5 um and less than or equal to 10 um, so as to ensure that the line width is not too thin to break the line, and the line width is not too thick so that the parasitic capacitance is too large; for example, the line width can be 5 um, 6 um, 7 um, 8 um, 9 um or 10 um;

The distance between the first conducting line and the second conducting line is greater than or equal to 6 um and less than or equal to 8 um to ensure the minimum accuracy of laser cutting; for example, the distance can be 6 um, 7 um or 8 um.

FIG. 1 is a schematic diagram of a positional relationship between an orthographic projection of a first connection line on abase substrate and an orthographic projection of a scanning line on the base substrate according to at least one embodiment of the present disclosure.

In FIG. 1, the one labeled LX1 is the first connection line part, the one labeled DX1 is the first conducting line, the one labeled DX2 is the second conducting line, and the one labeled LX2 is the second connection line part; the one labeled S0 is the scanning line;

The first connection line includes a first connection line part LX1, a first conducting line DX1, a second conducting line DX2 and a second connection line part LX2 electrically connected to each other;

As shown in FIG. 1, there is a first overlapping portion CD1 between the orthographic projection of DX1 on the base substrate and the orthographic projection of S0 on the base substrate, and there is a second overlapping portion CD2 between the orthographic projections of DX2 on the base substrate and the orthographic projection of S0 on the base substrate.

In at least one embodiment of the present disclosure, the second connection line includes a third connection line part, a third conducting line, a fourth conducting line and a fourth connection line part;

The second node is electrically connected to the 2nth stage of output circuit through the third connection line part, and the third connection line part is respectively electrically connected to a third conducting line and a fourth conducting line, and the third conducting line and the fourth conducting line are respectively electrically connected to the (2n−1)th stage of driving circuit through the fourth connection line part;

There is a third overlapping portion between the orthographic projection of the scanning line on the base substrate and the orthographic projection of the third conducting line on the base substrate, there is a fourth overlapping portion between the orthographic projection of the scanning line on the base substrate and the orthographic projection of the fourth conducting line on the base substrate;

The third overlapping portion and the fourth overlapping portion are independent of each other.

In specific implementation, the second connection line may include a third connection line part, a third conducting line, a fourth conducting line and a fourth connection line part, and the third connection line part is electrically connected to the fourth connection line part through the third conducting line and the fourth conducting line respectively. There is a third overlapping portion between the orthographic projection of the scanning line on the base substrate and the orthographic projection of the third conducting line on the base substrate, there is a fourth overlapping portion between the orthographic projection of the scanning line on the base substrate and the orthographic projection of the fourth conducting line on the base substrate, the third overlapping portion and the fourth overlapping portion are independent of each other, so that when there is a short circuit defect between the scanning line and the third conducting line, the third conducting line can be cut off by laser, so as to ensure that the driving module works normally while eliminating the short circuit defect, when there is a short circuit defect between the scanning line and the fourth conducting line, the fourth conducting line can be cut off by laser, so as to ensure the normal operation of the driving module while eliminating the short circuit defect.

In at least one embodiment of the present disclosure, the line width of the third conducting line is greater than or equal to 5 um and less than or equal to 10 um, and the line width of the fourth conducting line is greater than or equal to 5 um and less than or equal to 10 um, so as to ensure that the line width is not too thin to break the line, and the line width is not too thick so that the parasitic capacitance will not be too large; for example, the line width can be 5 um, 6 um, 7 um, 8 um, 9 um or 10 um;

The distance between the third conducting line and the fourth conducting line is greater than or equal to 6 um and less than or equal to 8 um to ensure the minimum accuracy of laser cutting; for example, the distance can be 6 um, 7 um or 8 um.

Figure 2:
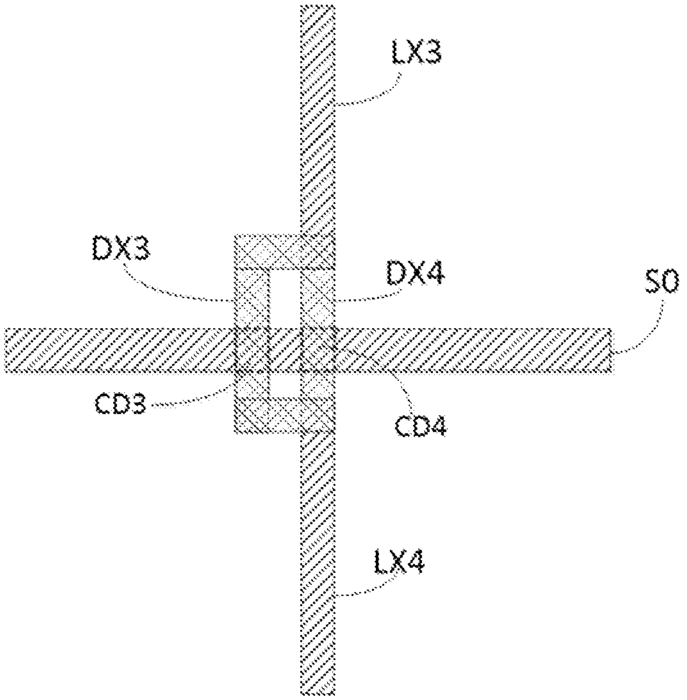
FIG. 2 is a schematic diagram of the positional relationship between the orthographic projection of the second connection line on the base substrate and the orthographic projection of the scanning line on the base substrate according to at least one embodiment of the present disclosure.

FIG. 2 is a schematic diagram of the positional relationship between the orthographic projection of the second connection line on the base substrate and the orthographic projection of the scanning line on the base substrate in at least one embodiment of the present disclosure.

In FIG. 2, the one labeled LX3 is the third connection line part, the one labeled DX3 is the third conducting line, the one labeled DX4 is the fourth conducting line, and the one labeled LX4 is the fourth connection part; the one labeled S0 is the scanning line;

The second connection line includes a third connection line part LX3, a third conducting line DX3, a fourth conducting line DX4 and a fourth connection line part LX4 electrically connected to each other;

As shown in FIG. 2, there is a third overlapping portion CD3 between the orthographic projection of DX3 on the base substrate and the orthographic projection of S0 on the base substrate, and there is a fourth overlapping portion CD4 between the orthographic projections of DX4 on the base substrate and the orthographic projection of S0 on the base substrate.

In at least one embodiment of the present disclosure, the scanning line includes a first scanning connection line, a first scanning line part, a second scanning line part, and a second scanning connection line;

The first scanning connection line is electrically connected to the second scanning connection line through the first scanning line part and the second scanning line part;

There is a fifth overlapping portion between the orthographic projection of the first connection line on the base substrate and the orthographic projection of the first scanning line part on the base substrate, there is a sixth overlapping portion between the orthographic projection of the first connection line on the base substrate and the orthographic projection of the second scanning line part on the base substrate;

The fifth overlapping portion and the sixth overlapping portion are independent of each other.

In a specific implementation, the scanning lines may include a first scanning connection line, a first scanning line part, a second scanning line part and a second scanning connection line electrically connected to each other, and the first scanning connection line is electrically connected to the second scanning connection line respectively through the first scanning line part and the second scanning line part, there is a fifth overlapping portion between the orthographic projection of the first connection line on the base substrate and the orthographic projection of the first scanning line part on the base substrate, and there is a sixth overlapping portion between the orthographic projection of the first connection line on the base substrate and the orthographic projection of the second scanning line portion on the base substrate; the fifth overlapping portion and the sixth overlapping portion are independent of each other, so that when the first scanning line part and the first connection line are short-circuited, the first scanning line part can be cut by laser, and the normal operation of the driving module can be ensured at the same time, and when there is a short circuit between the second scanning line part and the first connection line, the second scanning line can be cut by laser, and to ensure the normal operation of the driving module at the same time.

In at least one embodiment of the present disclosure, the line width of the first scanning line part is greater than or equal to 5 um and less than or equal to 10 um, and the line width of the second scanning line part is greater than or equal to 5 um and less than or equal to 10 um, so as to ensure that the line width is not too thin to break the line, and the line width is not too thick so that parasitic capacitance will not be too large; for example, the line width can be 5 um, 6 um, 7 um, 8 um, 9 um or 10 um;

The distance between the first scanning line part and the second scanning line part is greater than or equal to 6 um and less than or equal to 8 um to ensure the minimum accuracy of laser cutting; for example, the distance can be 6 um, 7 um or 8 um.

Figure 3:
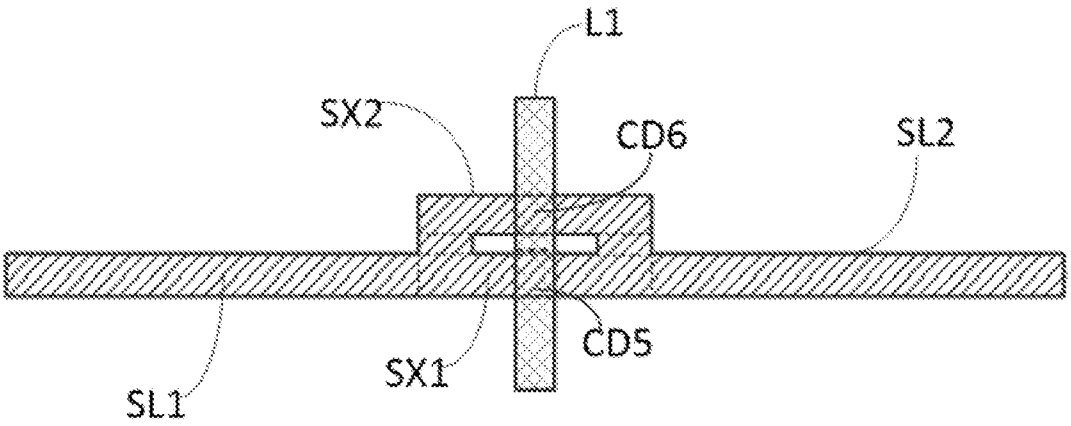
FIG. 3 is a schematic diagram of the positional relationship between the orthographic projection of the first connection line on the base substrate and the orthographic projection of the scanning line on the base substrate according to at least one embodiment of the present disclosure.

FIG. 3 is a schematic diagram of the positional relationship between the orthographic projection of the first connection line on the base substrate and the orthographic projection of the scanning line on the base substrate according to at least one embodiment of the present disclosure.

In FIG. 3, the scanning lines include the first scanning connection line SL1, the first scanning line part SX1, the second scanning line part SX2 and the second scanning connection line SL2; the one labeled L1 is the first connection line;

There is a fifth overlapping portion CD5 between the orthographic projection of SX1 on the base substrate and the orthographic projection of L1 on the base substrate, and there is a sixth overlapping portion CD6 between the orthographic projection of SX2 on the base substrate and the orthographic projection of L1 on the base substrate.

In at least one embodiment of the present disclosure, the scanning line include a third scanning connection line, a third scanning line part, a fourth scanning line part and a fourth scanning connection line;

The third scanning connection line is electrically connected to the fourth scanning connection line through the third scanning line part and the fourth scanning line part, and there is a seventh overlapping portion between the orthographic projection of the second connection line on the base substrate and the orthographic projection of the third scanning line part on the base substrate, there is an eighth overlapping portion between the orthographic projection of the second connection line on the base substrate and the orthographic projection of the fourth scanning line part on the base substrate;

The seventh overlapping portion and the eighth overlapping portion are independent of each other.

In a specific implementation, the scanning line may include a third scanning connection line, a third scanning line part, a fourth scanning line part and a fourth scanning connection line electrically connected to each other, and the third scanning connection line is electrically connected to the fourth scanning connection line through the third scanning line part and the fourth scanning line part respectively, and there is a seventh overlapping portion between the orthographic projection of the second connection line on the base substrate and the orthographic projection of the third scanning line part on the base substrate, and there is an eighth overlapping portion between the orthographic projection of the second connection line on the base substrate and the orthographic projection of the fourth scanning line part on the base substrate; the seventh overlapping portion and the eighth overlapping portion are independent of each other, so that when the third scanning line part and the second connection line are short-circuited, the third scanning line part can be cut off by laser, and to ensure the normal operation of the driving module at the same time, and when there is a short circuit between the fourth scanning line part and the second connection line, to cut off the fourth scanning line by laser, and ensure the normal operation of the driving module at the same time.

In at least one embodiment of the present disclosure, the line width of the third scanning line part is greater than or equal to 5 um and less than or equal to 10 um, and the line width of the fourth scanning line part is greater than or equal to 5 um and less than or equal to 10 um, so as to ensure that the line width is not too thin to break the line, and the line width is not too thick so that parasitic capacitance will not be too large; for example, the line width can be 5 um, 6 um, 7 um, 8 um, 9 um or 10 um;

The distance between the third scanning line part and the fourth scanning line part is greater than or equal to 6 um and less than or equal to 8 um to ensure the minimum accuracy of laser cutting; for example, the distance can be 6 um, 7 um or 8 um.

Figure 4:
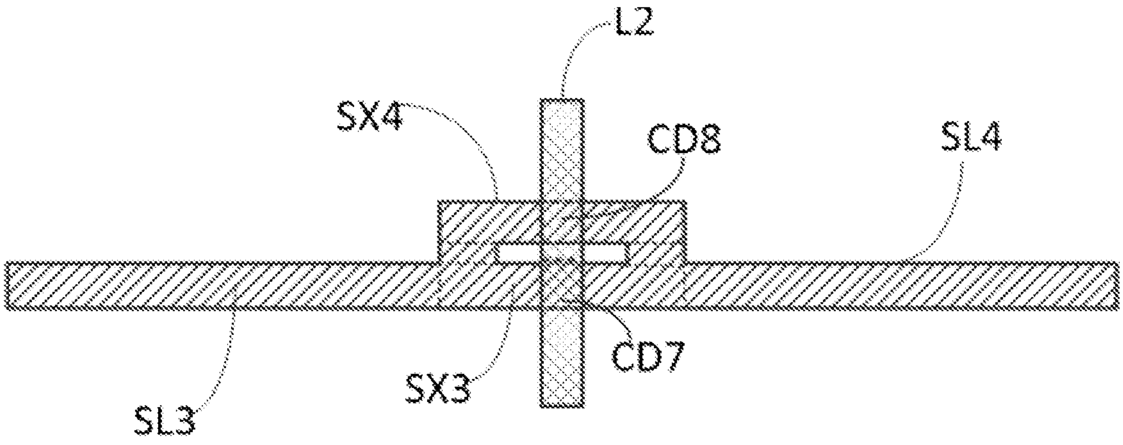
FIG. 4 is a schematic diagram of the positional relationship between the orthographic projection of the second connection line on the base substrate and the orthographic projection of the scanning line on the base substrate according to at least one embodiment of the present disclosure.

FIG. 4 is a schematic diagram of the positional relationship between the orthographic projection of the second connection line on the base substrate and the orthographic projection of the scanning line on the base substrate according to at least one embodiment of the present disclosure.

In FIG. 4, the scanning line includes the third scanning connection line SL3, the third scanning line part SX3, the fourth scanning line part SX4 and the fourth scanning connection line SL4; the one labeled L2 is the second connection line;

There is a seventh overlapping portion CD7 between the orthographic projection of SX3 on the base substrate and the orthographic projection of L2 on the base substrate, and there is an eighth overlapping portion CD8 between the orthographic projection of SX4 on the base substrate and the orthographic projection of L2 on the base substrate.

Optionally, the driving module includes a shift register, a first driving unit, a second driving unit, a first scanning line, a second scanning line, and a shift scanning line; the first driving unit is electrically connected to the first scanning line and is configured to provide the first scanning signal for the first scanning line; the second driving unit is electrically connected to the second scanning line and is configured to provide the second scanning signal for the second scanning line; the shift register is electrically connected to the shift scanning line and is configured to provide a shift scanning signal for the shift scanning line;

The shift register, the first driving unit and the second driving unit are arranged in sequence along a direction close to the display area.

Optionally, the driving module further includes a third scanning line and a third driving unit; the third driving unit is electrically connected to the third scanning line, and is configured to provide a third scanning signal for the third scanning line;

The third driving unit is arranged on a side of the second driving unit close to the display area.

In specific implementation, the driving module may include a bit register, a first driving unit, a second driving unit, a third driving unit, a first scanning line, a second scanning line and a shift scanning line; the first driving unit is configured to provide the first scanning signal for the first scanning line, the second driving unit is configured to provide the second scanning signal for the second scanning line; the shift register is configured to provide the shift scanning signal for the shift scanning line, the third driving unit is configured to provide a third scanning signal for the third scanning line.

In at least one embodiment of the present disclosure, the third scanning line may be a light emitting control line, and the third scanning signal may be a light emitting control signal, but not limited thereto.

Figure 5:
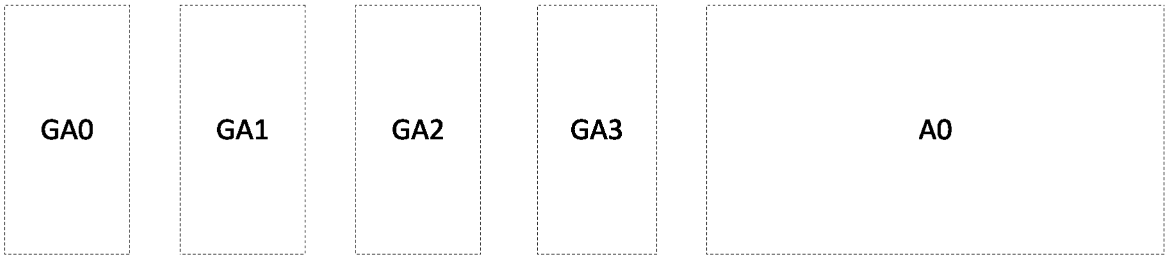
FIG. 5 is a schematic diagram of the positional relationship between the shift register GA0, the first driving unit GA1, the second driving unit GA2 and the third driving unit GA3 according to at least one embodiment of the present disclosure.

In at least one embodiment of the present disclosure, as shown in FIG. 5, the one labeled GA0 is a shift register, the one labeled GA1 is a first driving unit, the one labeled GA2 is a second driving unit, and the one labeled GA3 is a third driving unit, GA0, GA1, GA2 and GA3 are arranged in sequence along a direction close to the display area AO.

Optionally, the first driving unit includes a plurality of stages of first driving circuit;

The nth stage of first driving circuit includes a (2n−1)th stage of first output circuit, a 2nth stage of first output circuit, a first first node control circuit and a first second node control circuit;

The first first node control circuit is electrically connected to the first first node, and is configured to control the potential of the first first node;

The first second node control circuit is electrically connected to the first second node and is configured to control the potential of the first second node;

The (2n−1)th stage of first output circuit is electrically connected to the first first node, the first second node, and the (2n−1)th stage of first driving output terminal respectively, is configured to control to provide a (2n−1)th stage of first scanning signal through the (2n−1)th stage of first driving output terminal under the control of the potential of a first node and the potential of the first second node;

The 2nth stage of first output circuit is electrically connected to the first first node, the first second node, and the 2nth stage of first driving output terminal, respectively, is configured to control to provide a 2nth stage of first scanning signal through the 2nth stage of first driving output terminal under the control of the potential of the first first node and the potential of the first second node;

The driving module further includes a first scanning line of the (2n−1)th row and a first scanning line of the 2nth row; the (2n−1)th stage of first driving output terminal is electrically connected to the (2n−1)th stage of the first scanning line, the 2nth stage of the first driving output terminal is electrically connected to the first scanning line of the 2nth row;

The first first node is respectively electrically connected to the (2n−1)th stage of first output circuit and the 2nth stage of first output circuit through a first first connection line;

The first second node is respectively electrically connected to the (2n−1)th stage of first output circuit and the 2nth stage of first output circuit through the first second connection line;

There are at least two mutually independent overlapping portions between the orthographic projection of the first first connection line on the base substrate and the orthographic projection of the shift scanning line on the base substrate, there are at least two mutually independent overlapping portions between the orthographic projection of the first second connection line on the base substrate and the orthographic projection of the shift scanning line on the base substrate.

Figure 6:
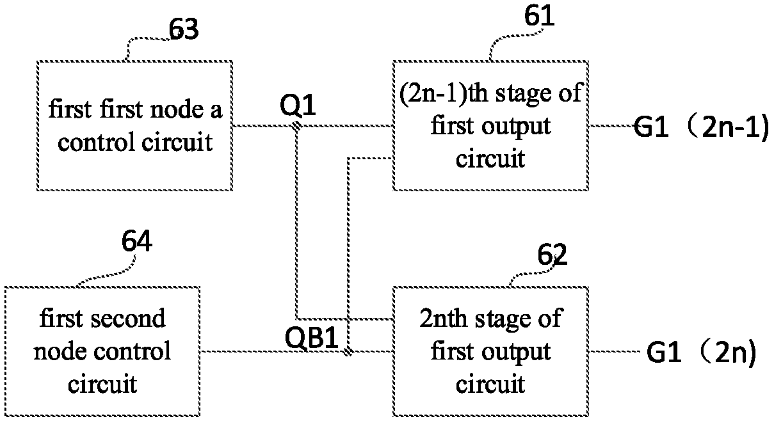
FIG. 6 is a structural diagram of an nth stage of first driving circuit according to at least one embodiment of the present disclosure.

In at least one embodiment of the present disclosure, as shown in FIG. 6, the nth stage of first driving circuit may include a (2n−1)th stage of first output circuit 61, a 2nth stage of first output circuit 62, a first first node a control circuit 63 and a first second node control circuit 64;

The first first node control circuit 63 is electrically connected to the first first node Q1 and is configured to control the potential of the first first node Q1;

The first second node control circuit 64 is electrically connected to the first second node QB1, and is configured to control the potential of the first second node QB1;

The (2n−1)th stage of first output circuit 61 is respectively connected to the first first node Q1, the first second node QB1 and the (2n−1)th stage of first driving output terminal G1 (2n−1), is configured to control the (2n−1)th stage of first driving output terminal G1 (2n−1) to provide the (2n−1)th stage of first scanning signal under the control of the potential of the first first node Q1 and the potential of the first second node QB1;

The 2nth stage of first output circuit 62 is electrically connected to the first first node Q1, the first second node QB1 and the 2nth stage of first driving output terminal G1 (2n) respectively, is configured to control the 2nth stage of first driving output terminal G1 (2n) to provide the 2nth stage of first scanning signal under the control of the potential of the first first node Q1 and the potential of the first second node QB1.

Figure 7:
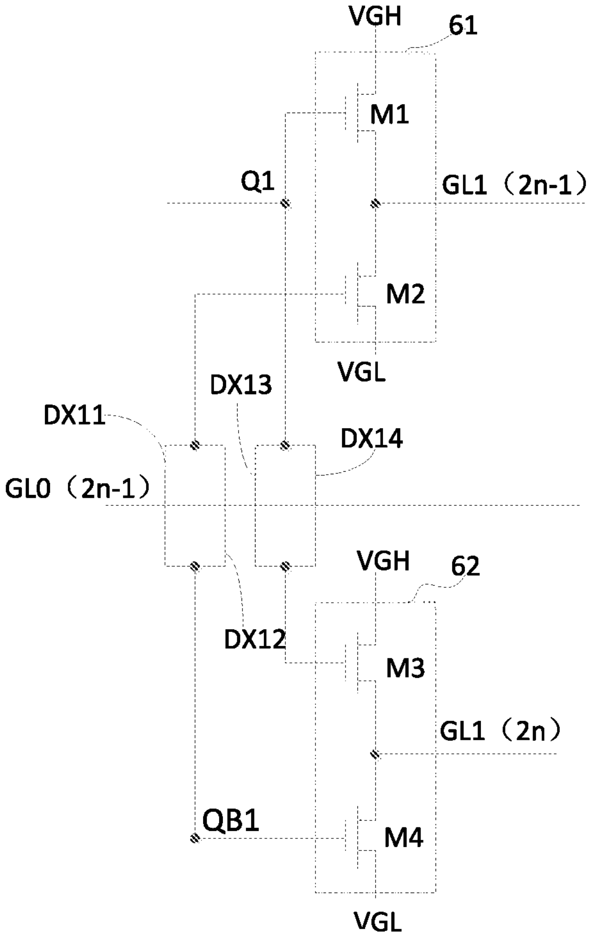
FIG. 7 is a circuit diagram of the (2n−1)th stage of first output circuit and a circuit diagram of the 2nth stage of first output circuit according to at least one embodiment.

In specific implementation, as shown in FIG. 7, the (2n−1)th stage of first output circuit 61 may include a first output transistor M1 and a second output transistor M2, and the 2nth stage of first output circuit 62 may include a third output transistor M3 and a fourth output transistor M4;

The gate electrode of M1 is electrically connected to the first first node Q1, the source electrode of M1 is connected to the high voltage VGH, and the drain electrode of M1 is electrically connected to the first scanning line GL1 (2n−1) of the (2n−1)th row;

The gate electrode of M2 is electrically connected to the first second node QB1, the source electrode of M2 is electrically connected to the first scanning line GL1 (2n−1) of the (2n−1)th row, and the drain electrode of M2 is connected to the low voltage VGL;

The gate electrode of M3 is electrically connected to the first first node Q1, the source electrode of M3 is connected to the high voltage VGH, and the drain electrode of M3 is electrically connected to the first scanning line GL1 (2n) of the 2nth row;

The gate electrode of M4 is electrically connected to the first second node QB1, the source electrode of M4 is electrically connected to the first scanning line GL1 (2n) of the 2nth row, and the drain electrode of M4 is connected to the low voltage VGL.

As shown in FIG. 7, the one labeled GL0 (2n−1) is the shift scanning line of the (2n−1)th row, the one labeled DX11 is the first first conducting line, and the one labeled DX12 is the first second conducting line, DX11 and DX12 extend vertically;

The one labeled DX13 is the first third conducting line, the one labeled DX14 is the first fourth conducting line, and DX13 and DX14 extend vertically;

The orthographic projection of DX11 on the base substrate partially overlaps the orthographic projection of GL0 (2n−1) on the base substrate, and the orthographic projection of DX12 on the base substrate partially overlaps the orthographic projection of GL0 (2n−1) on the base substrate;

The orthographic projection of DX13 on the base substrate partially overlaps the orthographic projection of GL0 (2n−1) on the base substrate, and the orthographic projection of DX14 on the base substrate partially overlaps the orthographic projection of GL0 (2n−1) on the base substrate.

Optionally, the second driving unit includes a plurality of stages of second driving circuit;

The nth stage of second driving circuit includes a (2n−1)th stage of second output circuit, a 2nth stage of second output circuit, a second first node control circuit and a second second node control circuit;

The second first node control circuit is electrically connected to the second first node, and is configured to control the potential of the second first node;

The second second node control circuit is electrically connected to the second second node, and is configured to control the potential of the second second node;

The (2n−1)th stage of second output circuit is electrically connected to the second first node, the second second node, and the (2n−1)th stage of second driving output terminal respectively, is configured to control to provide a (2n−1)th stage of second scanning signal through the (2n−1)th stage of second driving output terminal under the control of the potential of the second first node and the potential of the second second node;

The 2nth stage of second output circuit is electrically connected to the second first node, the second second node, and the 2nth stage of second driving output terminal, is configured to control to provide a 2nth stage of second scanning signal through the 2nth stage of second driving output terminal under the control of the potential of the second first node and the potential of the second second node;

The driving module also includes a second scanning line of the (2n−1)th row and a second scanning line of the 2nth row; the (2n−1)th stage of second driving output terminal of is electrically connected to the second scanning line of the (2n−1)th row, the 2nth stage of second driving output terminal is electrically connected to the second scanning line of the 2nth row;

The second first node is electrically connected to the (2n−1)th stage of second output circuit and the 2nth stage of second output circuit respectively through a second first connection line;

The second second node is respectively electrically connected to the (2n−1)th stage of second output circuit and the 2nth stage of second output circuit through a second second connection line;

There are at least two mutually independent overlapping portions between the orthographic projection of the second first connection line on the base substrate and the orthographic projection of the shift scanning line on the base substrate, there are at least two mutually independent overlapping portions between the orthographic projection of the second second connection line on the base substrate and the orthographic projection of the shift scanning line on the base substrate.

In at least one embodiment of the present disclosure, there are at least two mutually independent overlapping portions between the orthographic projection of the second first connection line on the base substrate and the orthographic projection of the first scanning line of the (2n−1)th row on the base substrate; there are at least two mutually independent overlapping portions between the orthographic projection of the second second connection line on the base substrate and the orthographic projection of the first scanning line of the (2n−1)th row on the base substrate; or, There are at least two mutually independent overlapping portions between the orthographic projection of the second first connection line on the base substrate and the orthographic projection of the first scanning line of the 2nth row on the base substrate; there are at least two mutually independent overlapping portions between the orthographic projection of the second second connection line on the base substrate and the orthographic projection of the first scanning line of the 2nth row on the base substrate.

Figure 8:
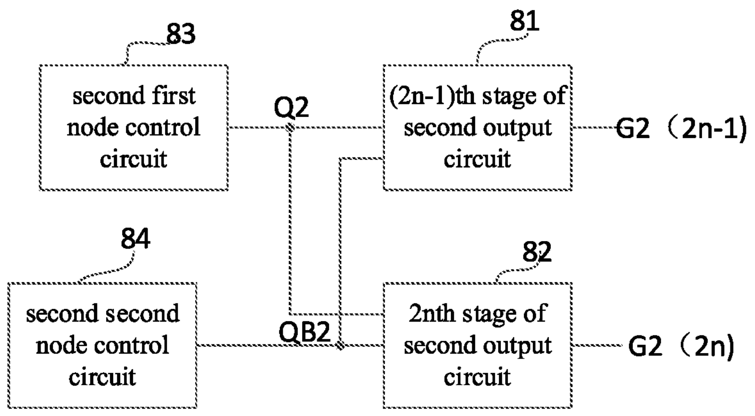
FIG. 8 is a structural diagram of an nth stage of second driving circuit according to at least one embodiment of the present disclosure.

In at least one embodiment of the present disclosure, as shown in FIG. 8, the nth stage of second driving circuit may include a (2n−1)th stage of second output circuit 81, a 2nth stage of second output circuit 82, a second first node control circuit 83 and a second second node control circuit 84;

The second first node control circuit 83 is electrically connected to the second first node Q2 and is configured to control the potential of the second first node Q2;

The second second node control circuit 84 is electrically connected to the second second node QB2, and is configured to control the potential of the second second node QB2;

The (2n−1)th stage of second output circuit 81 is respectively connected to the second first node Q2, the second second node QB2 and the (2n−1)th stage of second driving output terminal G2 (2n−1), is configured to control the (2n−1) stage of second driving output terminal G2 (2n−1) to provide the (2n−1)th stage of second scanning signal under the control of the potential of the second first node Q2 and the potential of the second second node QB2;

The 2nth stage of second output circuit 82 is electrically connected to the second first node Q2, the second second node QB2 and the 2nth stage of second driving output terminal G2 (2n) respectively, is configured to control the 2nth stage of second driving output terminal G2 (2n) to provide the 2nth stage of second scanning signal under the control of the potential of the second first node Q2 and the potential of the second second node QB2.

Figure 9:
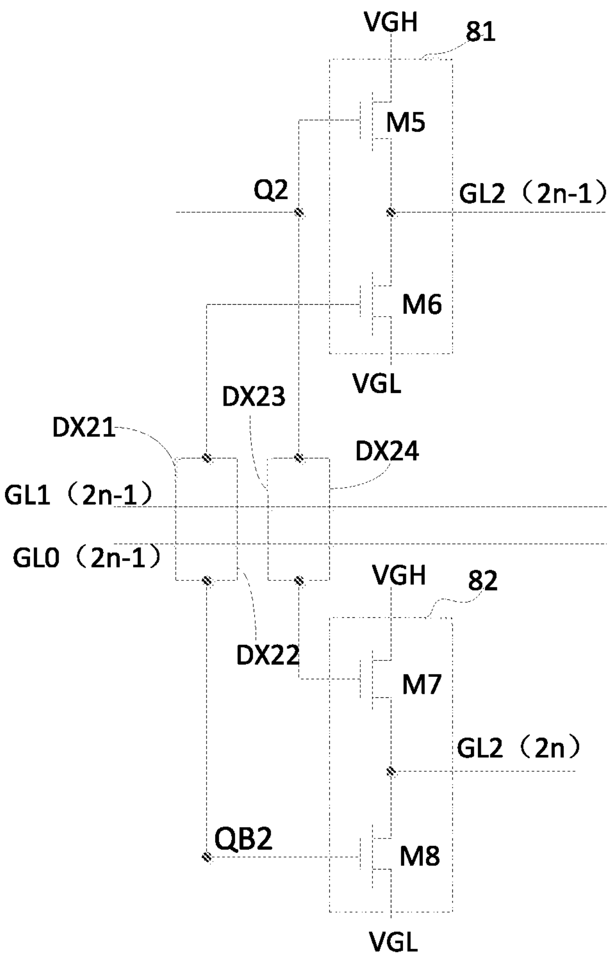
FIG. 9 is a circuit diagram of the (2n−1)th stage of second output circuit and a circuit diagram of the 2nth stage of second output circuit according to at least one embodiment.

In specific implementation, as shown in FIG. 9, the (2n−1)th stage of second output circuit 81 may include a fifth output transistor M5 and a sixth output transistor M6, and the 2nth stage of second output circuit 82 may include a seventh output transistors M7 and an eighth output transistor M8;

The gate electrode of M5 is electrically connected to the second first node Q2, the source electrode of M5 is connected to the high voltage VGH, and the drain electrode of M5 is electrically connected to the second scanning line GL2 (2n−1) of the (2n−1)th row;

The gate electrode of M6 is electrically connected to the second second node QB2, the source electrode of M6 is electrically connected to the second scanning line GL2 (2n−1) of the (2n−1)th row, and the drain electrode of M6 is connected to the low voltage VGL;

The gate electrode of M7 is electrically connected to the second first node Q2, the source electrode of M7 is connected to the high voltage VGH, and the drain electrode of M7 is electrically connected to the second scanning line GL2 (2n) of the 2nth row;

The gate electrode of M8 is electrically connected to the second second node QB2, the source electrode of M8 is electrically connected to the second scanning line GL2 (2n) of the 2nth row, and the drain electrode of M8 is connected to the low voltage VGL.

As shown in FIG. 9, the one labeled GL0 (2n−1) is the shift scanning line of the (2n−1)th row, and the one labeled GL1 (2n−1) is the first scanning line of (2n−1)th row;

The one labeled DX21 is the second first conducting line, the one labeled DX22 is the second second conducting line, and DX21 and DX22 extend vertically;

The one labeled DX23 is the second third conducting line, the one labeled DX24 is the second fourth conducting line, and DX23 and DX24 extend vertically;

The orthographic projection of DX21 on the base substrate partially overlaps the orthographic projection of GL0 (2n−1) on the base substrate, and the orthographic projection of DX22 on the base substrate partially overlaps the orthographic projection of GL0 (2n−1) on the base substrate;

The orthographic projection of DX21 on the base substrate partially overlaps the orthographic projection of GL1 (2n−1) on the base substrate, and the orthographic projection of DX22 on the base substrate partially overlaps the orthographic projection of GL1 (2n−1) on the base substrate;

The orthographic projection of DX23 on the base substrate partially overlaps the orthographic projection of GL0 (2n−1) on the base substrate, and the orthographic projection of DX24 on the base substrate partially overlaps the orthographic projection of GL0 (2n−1) on the base substrate;

The orthographic projection of DX23 on the base substrate partially overlaps the orthographic projection of GL1 (2n−1) on the base substrate, and the orthographic projection of DX24 on the base substrate partially overlaps the orthographic projection of GL1 (2n−1) on the base substrate.

In at least one embodiment of the present disclosure, the third driving unit includes a plurality of stages of third driving circuits;

The third driving unit includes a plurality of stages of third driving circuits;

The nth stage of third driving circuit includes a (2n−1)th stage of third output circuit, a 2nth stage of third output circuit, a third first node control circuit and a third second node control circuit;

The third first node control circuit is electrically connected to the third first node, and is configured to control the potential of the third first node;

The third second node control circuit is electrically connected to the third second node, and is configured to control the potential of the third second node;

The (2n−1)th stage of third output circuit is electrically connected to the third first node, the third second node and the (2n−1)th stage of third driving output terminal respectively, is configured to control to provide a (2n−1)th stage of third scanning signal through the (2n−1)th stage of third driving output terminal under the control of the potential of the third first node and the potential of the third second node;

The 2nth stage of third output circuit is electrically connected to the third first node, the third second node, and the 2nth stage of third driving output terminal, and is configured to control to provide a 2nth stage of third scanning signal through the 2nth stage of third driving output terminal under the control of the potential of the third first node and the potential of the third second node;

The driving module further includes a third scanning line of the (2n−1)th row and a third scanning line of the 2nth row; the (2n−1)th stage of the third driving output terminal is electrically connected to the third scanning line of the (2n−1)th row, the 2nth stage of third driving output terminal is electrically connected to the third scanning line of the 2nth row;

The third first node is respectively electrically connected to the (2n−1)th stage of third output circuit and the 2nth stage of third output circuit through a third first connection line;

The third second node is respectively electrically connected to the (2n−1)th stage of third output circuit and the 2nth stage of third output circuit through a third second connection line;

There are at least two mutually independent overlapping portions between the orthographic projection of the third first connection line on the base substrate and the orthographic projection of the shift scanning line on the base substrate, there are at least two mutually independent overlapping portions between the orthographic projection of the third second connection line on the base substrate and the orthographic projection of the shift scanning line on the base substrate.

In at least one embodiment of the present disclosure, there are at least two mutually independent overlapping portions between the orthographic projection of the third first connection line on the base substrate and the orthographic projection of the first scanning line of (2n−1)th row on the base substrate; there are at least two mutually independent overlapping portions between the orthographic projection of the third second connection line on the base substrate and the orthographic projection of the first scanning line of (2n−1)th row on the base substrate; there are at least two mutually independent overlapping portions between the orthographic projection of the third first connection line on the base substrate and the orthographic projection of the second scanning line of (2n−1)th row on the base substrate; there are at least two mutually independent overlapping portions between the orthographic projection of the third second connection line on the base substrate and the orthographic projection of the second scanning line of the (2n−1)th row on the base substrate; or, There are at least two mutually independent overlapping portions between the orthographic projection of the third first connection line on the base substrate and the orthographic projection of the first scanning line of the 2nth row on the base substrate; there are at least two mutually independent overlapping portions between the orthographic projection of the third second connection line on the base substrate and the orthographic projection of the first scanning line of the 2nth row on the base substrate; there are at least two mutually independent overlapping portions between the orthographic projection of the third first connection line on the base substrate and the orthographic projection of the second scanning line of the 2nth row on the base substrate; there are at least two mutually independent overlapping portions between the orthographic projection of the third second connection line on the base substrate and the orthographic projection of the second scanning line of the 2nth row on the base substrate.

Figure 10:
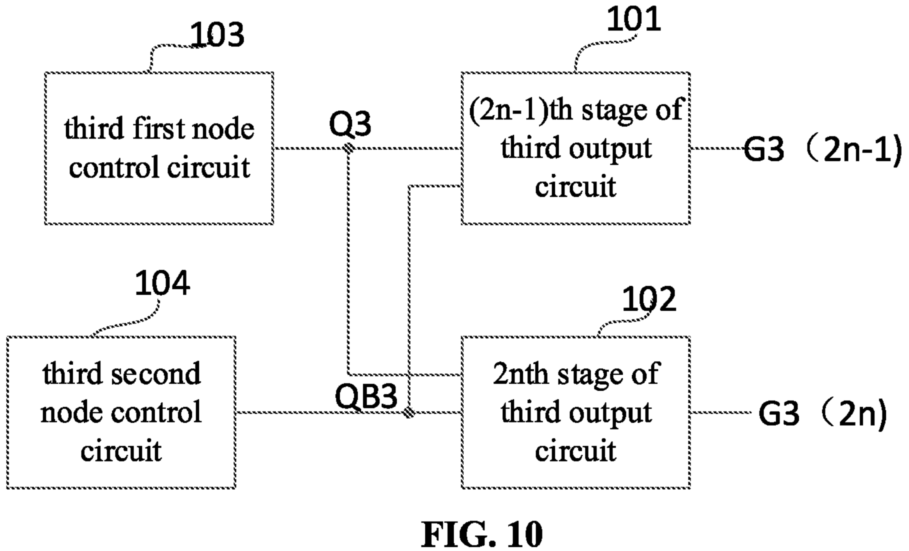
FIG. 10 is a structural diagram of an nth stage of third driving circuit according to at least one embodiment.

In at least one embodiment of the present disclosure, as shown in FIG. 10, the nth stage of third driving circuit may include a (2n−1)th stage of third output circuit 101, a 2nth stage of third output circuit 102, a third first node control circuit 103 and a third second node control circuit 104;

The third first node control circuit 103 is electrically connected to the third first node Q3, and is configured to control the potential of the third first node Q3;

The third second node control circuit 104 is electrically connected to the third second node QB3, and is configured to control the potential of the third second node QB3;

The (2n−1)th stage of third output circuit 101 is respectively connected to the third first node Q3, the third second node QB3 and the (2n−1)th stage of third driving output terminal G3 (2n−1), is configured to control the (2n−1)th stage of the third driving output terminal G3 (2n−1) to provide the (2n−1)th stage of third scanning signal under the control of the potential of the third first node Q3 and the potential of the third second node QB3;

The 2nth stage of third output circuit 102 is electrically connected to the third first node Q3, the third second node QB3 and the 2nth stage of third driving output terminal G3 (2n) respectively, is configured to the control the 2nth stage of third driving output terminal G3 (2n) to provide the 2nth stage of third scanning signal under the control of the potential of the third first node Q3 and the potential of the third second node QB3.

Figure 11:
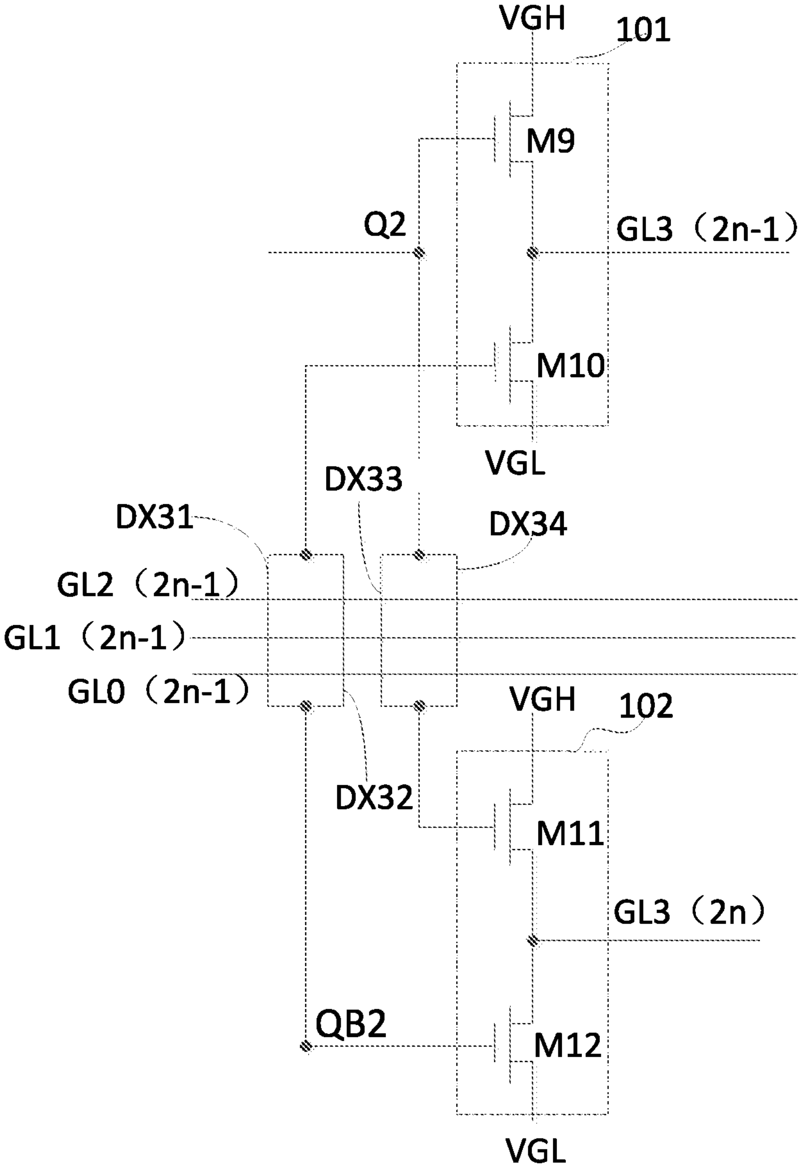
FIG. 11 is a circuit diagram of the (2n−1)th stage of third output circuit and a circuit diagram of the 2nth stage of third output circuit according to at least one embodiment.

In specific implementation, as shown in FIG. 11, the (2n−1)th stage of third output circuit 101 may include a ninth output transistor M9 and a tenth output transistor M10, and the 2nth stage of third output circuit 102 may include a an eleventh output transistor M11 and a twelfth output transistor M12;

The gate electrode of M9 is electrically connected to the third first node Q3, the source electrode of M9 is connected to the high voltage VGH, and the drain electrode of M9 is electrically connected to the third scanning line GL3 (2n−1) of (2n−1)th row;

The gate electrode of M10 is electrically connected to the third second node QB3, the source electrode of M10 is electrically connected to the third scanning line GL3 (2n−1) of the (2n−1)th row, and the drain electrode of M10 is connected to the low voltage VGL;

The gate electrode of M11 is electrically connected to the third first node Q3, the source electrode of M11 is connected to the high voltage VGH, and the drain electrode of M11 is electrically connected to the third scanning line GL3 (2n) of the 2nth row;

The gate electrode of M12 is electrically connected to the third second node QB3, the source electrode of M12 is electrically connected to the third scanning line GL3 (2n) of the 2nth row, and the drain electrode of M12 is connected to the low voltage VGL.

As shown in FIG. 11, the one labeled GL0 (2n−1) is the shift scanning line of the (2n−1)th row, and the one labeled GL1 (2n−1) is the first scanning line of the (2n−1)th row; the one labeled GL2 (2n−1) is the second scanning line of the (2n−1)th row;

The one labeled DX31 is the third first conducting line, the one labeled DX32 is the third second conducting line, and DX31 and DX32 extend vertically;

The one labeled DX33 is the third third conducting line, the one labeled DX34 is the third fourth conducting line, and DX33 and DX34 extend vertically;

The orthographic projection of DX31 on the base substrate partially overlaps the orthographic projection of GL0 (2n−1) on the base substrate, and the orthographic projection of DX32 on the base substrate partially overlaps the orthographic projection of GL0 (2n−1) on the base substrate projection;

The orthographic projection of DX31 on the base substrate partially overlaps the orthographic projection of GL1 (2n−1) on the base substrate, and the orthographic projection of DX32 on the projections partially overlaps the orthographic projection of GL1 (2n−1) on the base substrate;

The orthographic projection of DX31 on the base substrate partially overlaps the orthographic projection of GL2 (2n−1) on the base substrate, and the orthographic projection of DX32 on the base substrate partially the orthographic projection of GL2 (2n−1) on the base substrate;

The orthographic projection of DX33 on the base substrate partially overlaps the orthographic projection of GL0 (2n−1) on the base substrate, and the orthographic projection of DX34 on the base substrate partially overlaps the orthographic projection of GL0 (2n−1) on the base substrate;

The orthographic projection of DX33 on the base substrate partially overlaps the orthographic projection of GL1 (2n−1) on the base substrate, and the orthographic projection of DX34 on the base substrate partially overlaps the orthographic projection of GL1 (2n−1) on the base substrate;

The orthographic projection of DX33 on the base substrate partially overlaps the orthographic projection of GL2 (2n−1) on the base substrate, and the orthographic projection of DX34 on the base substrate partially overlaps the orthographic projection of GL2 (2n−1) on the base substrate.

Figure 12:
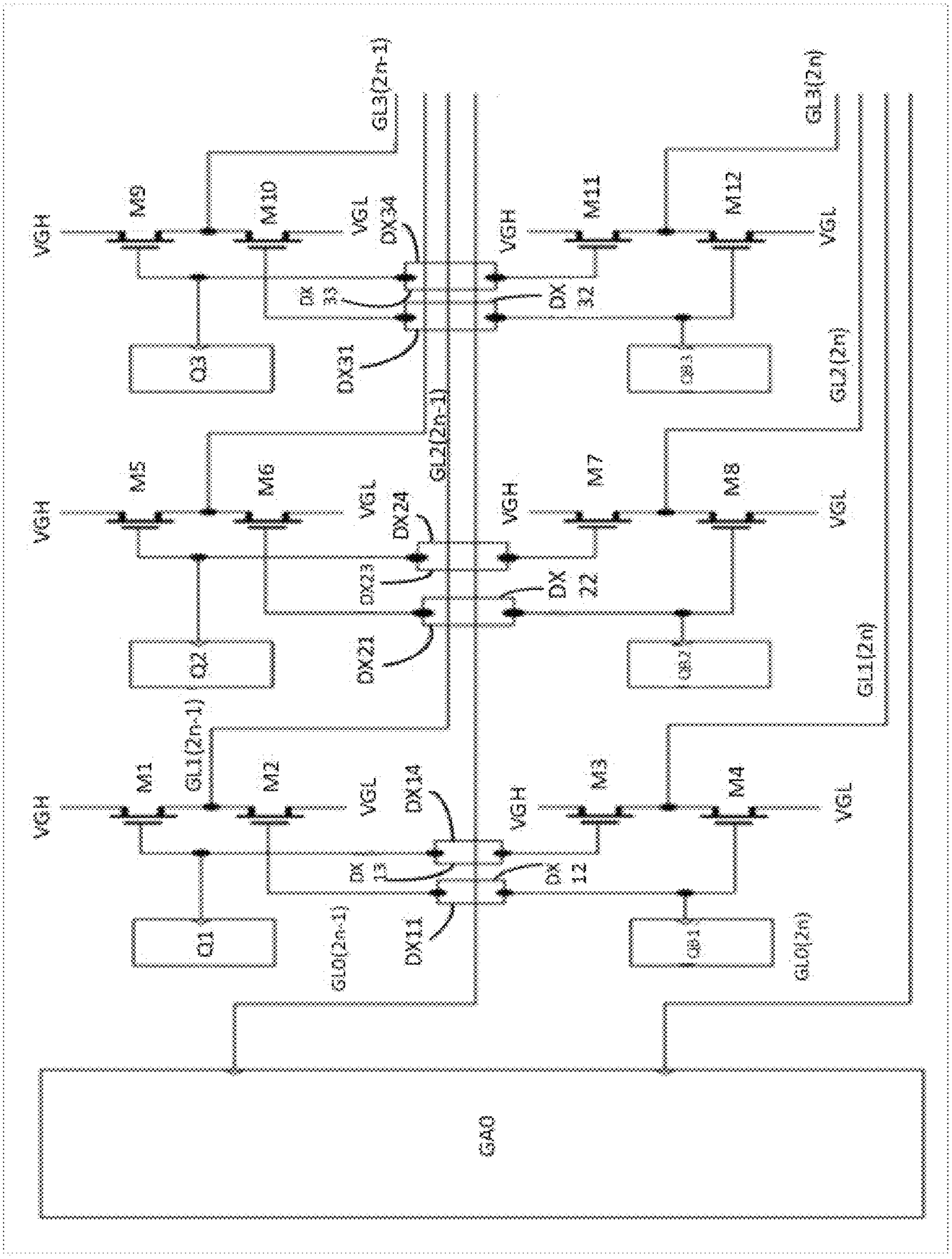
FIG. 12 is a circuit diagram of a driving module included in the display substrate according to at least one embodiment of the present disclosure.

In FIG. 12, the one labeled GA0 is the shift register, the one labeled GL0 (2n−1) is the shift scanning line of the (2n−1)th row, and the one labeled GL0 (2n) is the shift scanning line of the 2nth row;

The (2n−1)th stage of first output circuit includes a first output transistor M1 and a second output transistor M2, and the 2nth stage of first output circuit includes a third output transistor M3 and a fourth output transistor M4;

The gate electrode of M1 is electrically connected to the first first node Q1, the source electrode of M1 is connected to the high voltage VGH, and the drain electrode of M1 is electrically connected to the first scanning line GL1 (2n−1) of the (2n−1)th row;

The gate electrode of M2 is electrically connected to the first second node QB1, the source electrode of M2 is electrically connected to the first scanning line GL1 (2n−1) of the (2n−1)th row, and the drain electrode of M2 is connected to the low voltage VGL;

The gate electrode of M3 is electrically connected to the first first node Q1, the source electrode of M3 is connected to the high voltage VGH, and the drain electrode of M3 is electrically connected to the first scanning line GL1 (2n) of the 2nth row;

The gate electrode of M4 is electrically connected to the first second node QB1, the source electrode of M4 is electrically connected to the first scanning line GL1 (2n) of the 2nth row, and the drain electrode of M4 is connected to the low voltage VGL;

Q1 is electrically connected to the gate electrode of M3 through the first first conducting line DX11 and the first second conducting line DX12 respectively;

QB1 is electrically connected to the gate electrode of M2 through the first third conducting line DX13 and the first third conducting line DX14 respectively;

The orthographic projection of DX11 on the base substrate partially overlaps the orthographic projection of GL0 (2n−1) on the base substrate;

The orthographic projection of DX12 on the base substrate partially overlaps the orthographic projection of GL0 (2n−1) on the base substrate;

The orthographic projection of DX13 on the base substrate partially overlaps the orthographic projection of GL0 (2n−1) on the base substrate;

The orthographic projection of DX14 on the base substrate partially overlaps the orthographic projection of GL0 (2n−1) on the base substrate;

The (2n−1)th stage of second output circuit includes a fifth output transistor M5 and a sixth output transistor M6, and the 2nth stage of second output circuit may include a seventh output transistor M7 and an eighth output transistor M8;

The gate electrode of M5 is electrically connected to the second first node Q2, the source electrode of M5 is connected to the high voltage VGH, and the drain electrode of M5 is electrically connected to the second scanning line GL2 (2n−1) of the (2n−1)th row;

The gate electrode of M6 is electrically connected to the second second node QB2, the source electrode of M6 is electrically connected to the second scanning line GL2 (2n−1) of the (2n−1)th row, and the drain electrode of M6 is connected to the low voltage VGL;

The gate electrode of M7 is electrically connected to the second first node Q2, the source electrode of M7 is connected to the high voltage VGH, and the drain electrode of M7 is electrically connected to the second scanning line GL2 (2n) of the 2nth row;

The gate electrode of M8 is electrically connected to the second second node QB2, the source electrode of M8 is electrically connected to the second scanning line GL2 (2n) of the 2nth row, and the drain electrode of M8 is connected to the low voltage VGL;

Q2 is electrically connected to the gate electrode of M7 through the second first conducting line DX21 and the second second conducting line DX22 respectively;

QB2 is electrically connected to the gate electrode of M6 through the second third conducting line DX23 and the second fourth conducting line DX24 respectively;

The orthographic projection of DX21 on the base substrate partially overlaps the orthographic projection of GL0 (2n−1) on the base substrate, and the orthographic projection of DX22 on the base substrate partially overlaps the orthographic projection of GL0 (2n−1) on the base substrate;

The orthographic projection of DX21 on the base substrate partially overlaps the orthographic projection of GL1 (2n−1) on the base substrate, and the orthographic projection of DX22 on the base substrate partially overlaps the orthographic projection of GL1 (2n−1) on the base substrate;

The orthographic projection of DX23 on the base substrate partially overlaps the orthographic projection of GL0 (2n−1) on the base substrate, and the orthographic projection of DX24 on the base substrate partially overlaps the orthographic projection of GL0 (2n−1) on the base substrate;

The orthographic projection of DX23 on the base substrate partially overlaps the orthographic projection of GL1 (2n−1) on the base substrate, and the orthographic projection of DX24 on the base substrate partially overlaps the orthographic projection of GL1 (2n−1) on the base substrate;

The (2n−1)th stage of third output circuit may include a ninth output transistor M9 and a tenth output transistor M10, and the 2nth stage of third output circuit may include an eleventh output transistor M11 and a twelfth output transistor M12;

The gate electrode of M9 is electrically connected to the third first node Q3, the source electrode of M9 is connected to the high voltage VGH, and the drain electrode of M9 is electrically connected to the third scanning line GL3 (2n−1) of the (2n−1)th row;

The gate electrode of M10 is electrically connected to the third second node QB3, the source electrode of M10 is electrically connected to the third scanning line GL3 (2n−1) of the (2n−1)th row, and the drain electrode of M10 is connected to the low voltage VGL;

The gate electrode of M11 is electrically connected to the third first node Q3, the source electrode of M11 is connected to the high voltage VGH, and the drain electrode of M11 is electrically connected to the third scanning line GL3 (2n) of the 2nth row;

The gate electrode of M12 is electrically connected to the third second node QB3, the source electrode of M12 is electrically connected to the third scanning line GL3 (2n) of the 2nth row, and the drain electrode of M12 is connected to the low voltage VGL;

Q3 is electrically connected to the gate electrode of M11 through DX31 and DX32 respectively;

QB3 is electrically connected to the gate electrode of M10 through DX33 and DX34 respectively;

The orthographic projection of DX31 on the base substrate partially overlaps the orthographic projection of GL0 (2n−1) on the base substrate, and the orthographic projection of DX32 on the base substrate partially overlaps the orthographic projection of GL0 (2n−1) on the base substrate;

The orthographic projection of DX31 on the base substrate partially overlaps the orthographic projection of GL1 (2n−1) on the base substrate, and the orthographic projection of DX32 on the base substrate partially overlaps the orthographic projection of GL1 (2n−1) on the base substrate;

The orthographic projection of DX31 on the base substrate partially overlaps the orthographic projection of GL2 (2n−1) on the base substrate, and the orthographic projection of DX32 on the base substrate partially overlaps the orthographic projection of GL2 (2n−1) on the base substrate;

The orthographic projection of DX33 on the base substrate partially overlaps the orthographic projection of GL0 (2n−1) on the base substrate, and the orthographic projection of DX34 on the base substrate partially overlaps the orthographic projection of GL0 (2n−1) on the base substrate;

The orthographic projection of DX33 on the base substrate partially overlaps the orthographic projection of GL1 (2n−1) on the base substrate, and the orthographic projection of DX34 on the base substrate partially overlaps the orthographic projection of GL1 (2n−1) on the base substrate;

The orthographic projection of DX33 on the base substrate partially overlaps the orthographic projection of GL2 (2n−1) on the base substrate, and the orthographic projection of DX34 on the base substrate partially overlaps the orthographic projection of GL2 (2n−1) on the base substrate.

Figure 13:
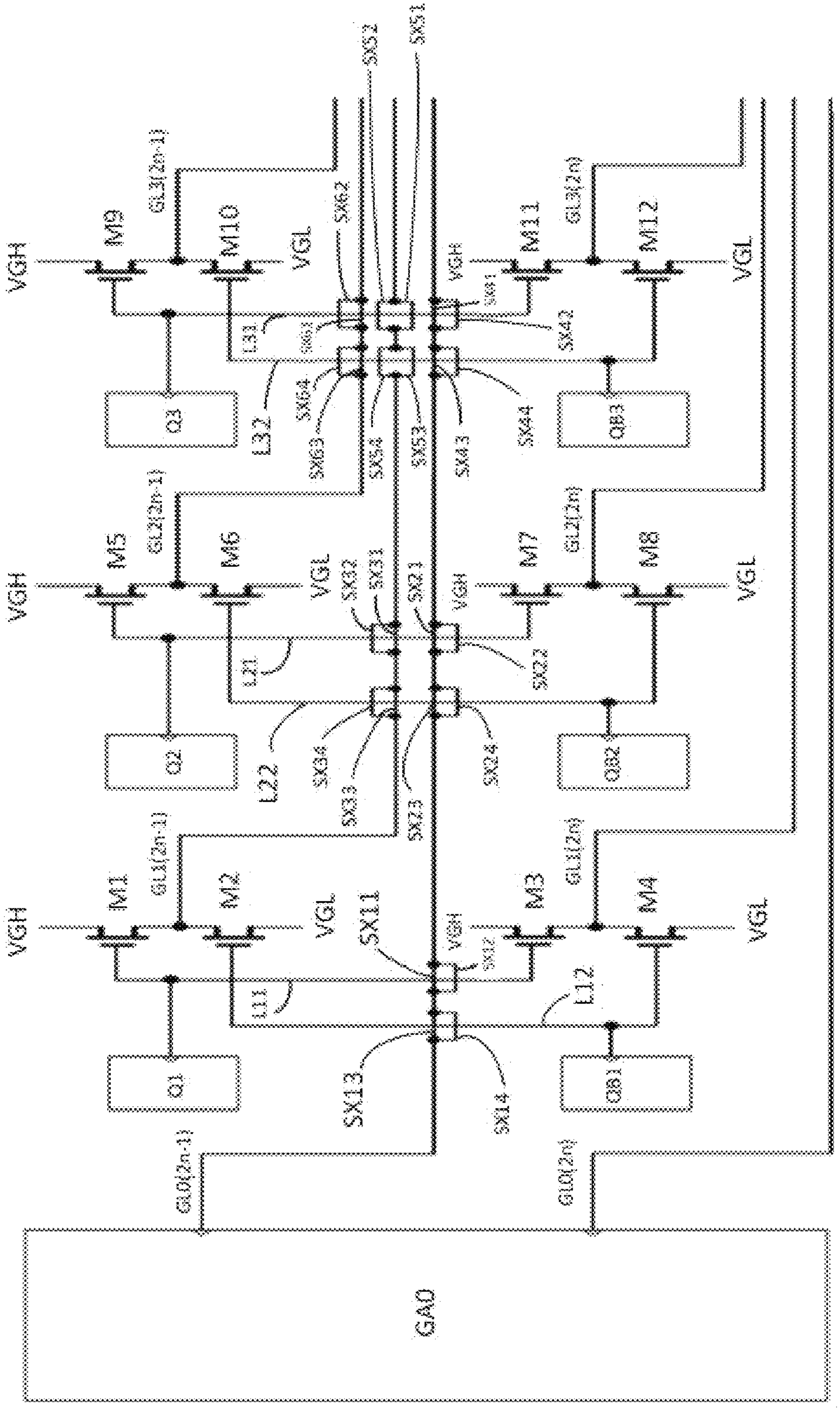
FIG. 13 is a circuit diagram of a driving module included in the display substrate according to at least one embodiment of the present disclosure.

In FIG. 13, the one labeled GA0 is a shift register, the one labeled GL0 (2n−1) is the shift scanning line of the (2n−1)th row, and the one labeled GL0 (2n) is the shift scanning line of the 2nth of row;

The (2n−1)th stage of first output circuit 61 includes a first output transistor M1 and a second output transistor M2, and the 2nth stage of first output circuit 62 includes a third output transistor M3 and a fourth output transistor M4;

The gate electrode of M1 is electrically connected to the first first node Q1, the source electrode of M1 is connected to the high voltage VGH, and the drain electrode of M1 is electrically connected to the first scanning line GL1 (2n−1) of the (2n−1)th row;

The gate electrode of M2 is electrically connected to the first second node QB1, the source electrode of M2 is electrically connected to the first scanning line GL1 (2n−1) of the (2n−1)th row, and the drain electrode of M2 is connected to the low voltage VGL;

The gate electrode of M3 is electrically connected to the first first node Q1, the source electrode of M3 is connected to the high voltage VGH, and the drain electrode of M3 is electrically connected to the first scanning line GL1 (2n) of the 2nth row;

The gate electrode of M4 is electrically connected to the first second node QB1, the source electrode of M4 is electrically connected to the first scanning line GL1 (2n) of the 2nth row, and the drain electrode of M4 is connected to the low voltage VGL;

Q1 is electrically connected to the gate electrode of M3 through the first first connection line L11;

QB1 is electrically connected to the gate electrode of M2 through the first second connection line L12;

GL0 (2n−1) includes the first first scanning line part SX11, the first second scanning line part SX12, the first third scanning line part SX13 and the first fourth scanning line part SX14;

SX11 and SX12 are connected in parallel, SX13 and SX14 are connected in parallel;

The orthographic projection of SX11 on the base substrate partially overlaps the orthographic projection of L11 on the base substrate; the orthographic projection of SX12 on the base substrate partially overlaps the orthographic projection of L11 on the base substrate;

The orthographic projection of SX13 on the base substrate partially overlaps the orthographic projection of L12 on the base substrate; the orthographic projection of SX14 on the base substrate partially overlaps the orthographic projection of L12 on the base substrate;

The (2n−1)th stage of second output circuit 81 includes a fifth output transistor M5 and a sixth output transistor M6, and the 2nth stage of second output circuit may include a seventh output transistor M7 and an eighth output transistor M8;

The gate electrode of M5 is electrically connected to the second first node Q2, the source electrode of M5 is connected to the high voltage VGH, and the drain electrode of M5 is electrically connected to the second scanning line GL2 (2n−1) of the (2n−1)th row;

The gate electrode of M6 is electrically connected to the second second node QB2, the source electrode of M6 is electrically connected to the second scanning line GL2 (2n−1) of the (2n−1)th row, and the drain electrode of M6 is connected to the low voltage VGL;

The gate electrode of M7 is electrically connected to the second first node Q2, the source electrode of M7 is connected to the high voltage VGH, and the drain electrode of M7 is electrically connected to the second scanning line GL2 (2n) of the 2nth row;

The gate electrode of M8 is electrically connected to the second second node QB2, the source electrode of M8 is electrically connected to the second scanning line GL2 (2n) of the 2nth row, and the drain electrode of M8 is connected to the low voltage VGL;

GL0 (2n−1) also includes a second first scanning line part SX21, a second second scanning line part SX22, a second third scanning line part SX23, and a second fourth scanning line part SX24;

SX21 and SX22 are connected in parallel, SX23 and SX24 are connected in parallel;

GL1 (2n−1) also includes a third first scanning line part SX31, a third second scanning line part SX32, a third third scanning line part SX33 and a fourth third scanning line part S43;

SX31 and SX32 are connected in parallel, SX33 and SX34 are connected in parallel;

Q2 is electrically connected to the gate electrode of M7 through the second first connection line L21;

QB2 is electrically connected to the gate electrode of M6 through the second second connection line L22;

The orthographic projection of SX21 on the base substrate partially overlaps the orthographic projection of L21 on the base substrate, and the orthographic projection of SX22 on the base substrate partially overlaps the orthographic projection of L21 on the base substrate;

The orthographic projection of SX23 on the base substrate partially overlaps the orthographic projection of L22 on the base substrate, and the orthographic projection of SX24 on the base substrate partially overlaps the orthographic projection of L22 on the base substrate;

The orthographic projection of SX31 on the base substrate partially overlaps the orthographic projection of L21 on the base substrate, and the orthographic projection of SX32 on the base substrate partially overlaps the orthographic projection of L21 on the base substrate;

The orthographic projection of SX33 on the base substrate partially overlaps the orthographic projection of L22 on the base substrate, and the orthographic projection of SX34 on the base substrate partially overlaps the orthographic projection of L22 on the base substrate;

The (2n−1)th stage of third output circuit 101 may include a ninth output transistor M9 and a tenth output transistor M10, and the 2nth stage of third output circuit 102 may include an eleventh output transistor M11 and a twelfth output transistor M12;

The gate electrode of M9 is electrically connected to the third first node Q3, the source electrode of M9 is connected to the high voltage VGH, and the drain electrode of M9 is electrically connected to the third scanning line GL3 (2n−1) of the (2n−1)th row;

The gate electrode of M10 is electrically connected to the third second node QB3, the source electrode of M10 is electrically connected to the third scanning line GL3 (2n−1) of the (2n−1)th row, and the drain electrode of M10 is connected to the low voltage VGL;

The gate electrode of M11 is electrically connected to the third first node Q3, the source electrode of M11 is connected to the high voltage VGH, and the drain electrode of M11 is electrically connected to the third scanning line GL3 (2n) of the 2nth row;

The gate electrode of M12 is electrically connected to the third second node QB3, the source electrode of M12 is electrically connected to the third scanning line GL3 (2n) of the 2nth row, and the drain electrode of M12 is connected to the low voltage VGL;

GL0 (2n−1) also includes a fourth first scanning line part SX41, a fourth second scanning line part SX42, a fourth third scanning line part SX43 and a fourth fourth scanning line part SX44;

SX41 and SX42 are connected in parallel, SX43 and SX44 are connected in parallel;

GL1 (2n−1) also includes the fifth first scanning line part SX51, the fifth second scanning line part SX52, the fifth third scanning line part SX53 and the fifth third scanning line part S53;

SX51 and SX52 are connected in parallel, SX53 and SX54 are connected in parallel;

GL2 (2n−1) also includes the sixth first scanning line part SX61, the sixth second scanning line part SX62, the sixth third scanning line part SX63 and the sixth third scanning line part S63;

SX61 and SX62 are connected in parallel, SX63 and SX64 are connected in parallel;

Q3 is electrically connected to the gate electrode of M11 through the third first connection line L31;

QB3 is electrically connected to the gate electrode of M10 through the third second connection line L32;

The orthographic projection of SX41 on the base substrate partially overlaps the orthographic projection of L31 on the base substrate, and the orthographic projection of SX42 on the base substrate partially overlaps the orthographic projection of L31 on the base substrate;

The orthographic projection of SX43 on the base substrate partially overlaps the orthographic projection of L32 on the base substrate, and the orthographic projection of SX44 on the base substrate partially overlaps the orthographic projection of L32 on the base substrate;

The orthographic projection of SX51 on the base substrate partially overlaps the orthographic projection of L31 on the base substrate, and the orthographic projection of SX52 on the base substrate partially overlaps the orthographic projection of L31 on the base substrate;

The orthographic projection of SX53 on the base substrate partially overlaps the orthographic projection of L32 on the base substrate, and the orthographic projection of SX54 on the base substrate partially overlaps the orthographic projection of L32 on the base substrate;

The orthographic projection of SX61 on the base substrate partially overlaps the orthographic projection of L31 on the base substrate, and the orthographic projection of SX62 on the base substrate partially overlaps the orthographic projection of L31 on the base substrate;

The orthographic projection of SX63 on the base substrate partially overlaps the orthographic projection of L32 on the base substrate, and the orthographic projection of SX64 on the base substrate partially overlaps the orthographic projection of L32 on the base substrate;

The display substrate according to at least one embodiment of the present disclosure includes a first gate metal layer and a first source-drain metal layer sequentially arranged on the base substrate;

The scanning line included in the driving module is arranged on the first gate metal layer;

The first connection line includes a first conducting line and a second conducting line, and the second connection line includes a third conducting line and a fourth conducting line;

The first conducting line, the second conducting line, the third conducting line and the fourth conducting line are all arranged on the first source-drain metal layer.

In a specific implementation, the scanning line may be arranged on the first gate metal layer, a first conducting line and a second conducting line included in the first connection line, and a third conducting line and the fourth conducting line included in the second connection line may be arranged on the first source-drain metal layer.

In at least one embodiment of the present disclosure, the display substrate includes a first gate metal layer, a first source-drain metal layer, and a second source-drain metal layer sequentially arranged on the base substrate;

The scanning line included in the driving module is arranged on the first gate metal layer;

The first connection line includes a first conducting line and a second conducting line, and the second connection line includes a third conducting line and a fourth conducting line;

The first conducting line, the second conducting line, the third conducting line and the fourth conducting line are all arranged on the second source-drain metal layer.

In a specific implementation, the scanning line may be arranged on the first gate metal layer, a first conducting line and a second conducting line included in the first connection line, and a third conducting line and a fourth conducting line included in the second connection line may be arranged on the second source-drain metal layer.

The display substrate according to at least one embodiment of the present disclosure includes a first gate metal layer, a first source-drain metal layer, and a second source-drain metal layer sequentially arranged on the base substrate;

The first conducting line is arranged on the first source-drain metal layer, and the second conducting line is arranged on the second source-drain metal layer; or, the first conducting line is arranged on the second source-drain metal layer, the second conducting line is arranged on the first source-drain metal layer.

In specific implementation, the first conducting line can be arranged on the first source-drain metal layer, the second conducting line can be arranged on the second source-drain metal layer, and the insulating layer between the second source-drain metal layer and the first gate metal layer includes an interlayer dielectric layer, a planarization layer and a passivation layer, the parasitic capacitance between the first gate metal layer and the second source-drain metal layer is small, which has fewer effect on the uniformity of the parasitic capacitance difference between the gate signals. The problem of horizontal stripes due to the difference in gate parasitic capacitance is eliminated in the display.

In at least one embodiment of the present disclosure, the display substrate includes a first gate metal layer, a first source-drain metal layer, and a second source-drain metal layer sequentially arranged on the base substrate;

The third conducting line is arranged on the first source-drain metal layer, and the fourth conducting line is arranged on the second source-drain metal layer; or, the third conducting line is arranged on the second source-drain metal layer, the fourth conducting line is arranged on the first source-drain metal layer.

In specific implementation, the third conducting line can be arranged on the first source-drain metal layer, the fourth conducting line can be arranged on the second source-drain metal layer, and the insulating layer between the second source-drain metal layer and the first gate metal layer includes an interlayer dielectric layer, a planarization layer and a passivation layer, the parasitic capacitance between the first gate metal layer and the second source-drain metal layer is small, which has fewer effect on the uniformity of the parasitic capacitance difference between the gate signals. The problem of horizontal stripes due to the difference in gate parasitic capacitance is eliminated in the display.

Figure 14:
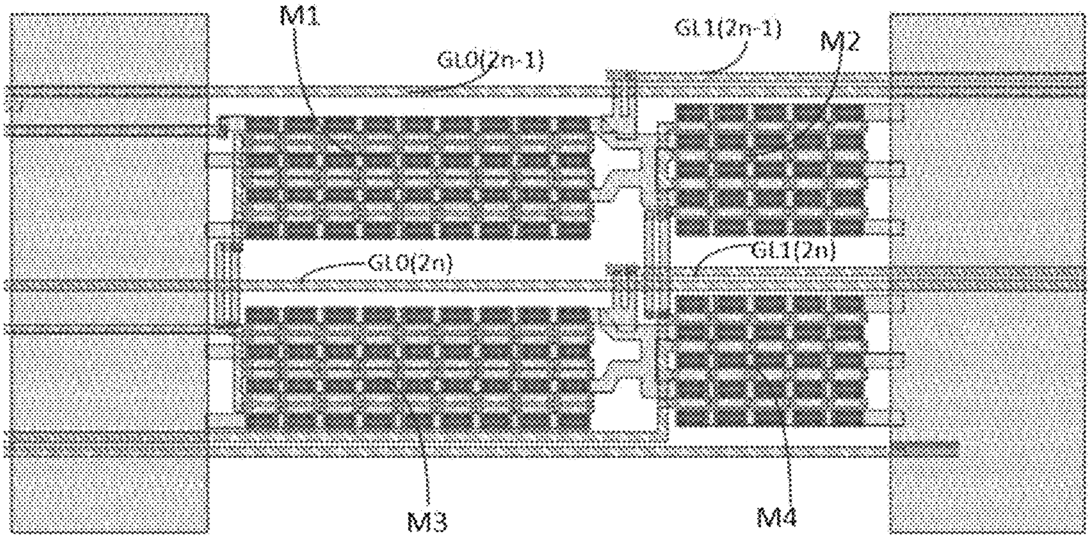
FIG. 14 is a schematic diagram of the overlapping relationship between the connection line between the first output transistor M1 and the third output transistor M3, the connection line between the second output transistor M2 and the fourth output transistor M4, and the scanning line.
Figure 15:
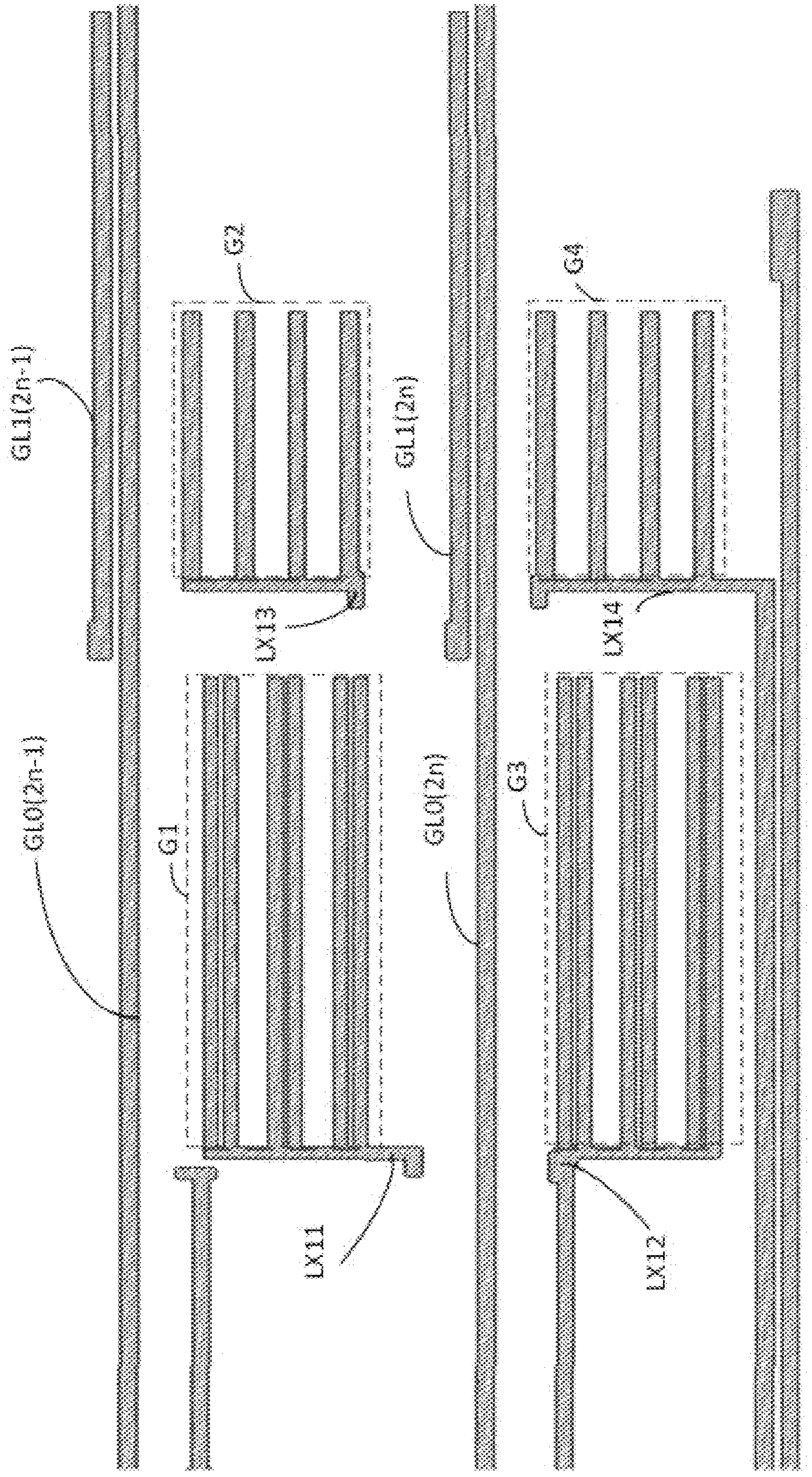

In FIG. 14, the one labeled M1 is the first output transistor, the one labeled M2 is the second output transistor, the one labeled M3 is the third output transistor, and the one labeled M4 is the fourth output transistor;

In FIG. 14 and FIG. 15, the one labeled GL0 (2n−1) is the shift scanning line of the (2n−1)th row; the one labeled GL1 (2n−1) is the first scanning line of the (2n−1)th row;

The one labeled GL0 (2n) is the shift scanning line of the 2nth row, and the one labeled GL1 (2n) is the first scanning line of the 2nth row.

In FIG. 15, the one labeled G1 is the gate electrode of M1, the one labeled G2 is the gate electrode of M2, the one labeled G3 is the gate electrode of M3, and the one labeled G4 is the gate electrode of M4;

In FIG. 15, the one labeled LX11 is the first first connection line part, and the one labeled LX12 is the first second connection line part;

The one labeled LX13 is the first third connection line part, and the one labeled LX14 is the first fourth connection line part.

Figure 17:
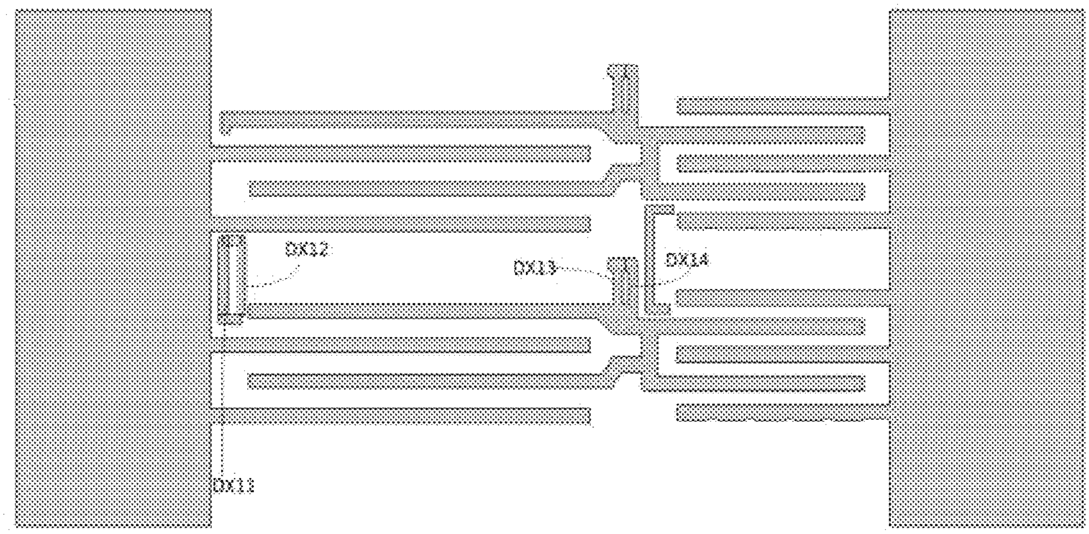
FIG. 17 is a layout diagram of the first source-drain metal layer in FIG. 14.

In FIG. 17, the one labeled DX11 is the first first conducting line, and the one labeled DX12 is the first second conducting line;

The one labeled DX13 is the first third conducting line, and the one labeled DX14 is the first third conducting line.

Figure 16:
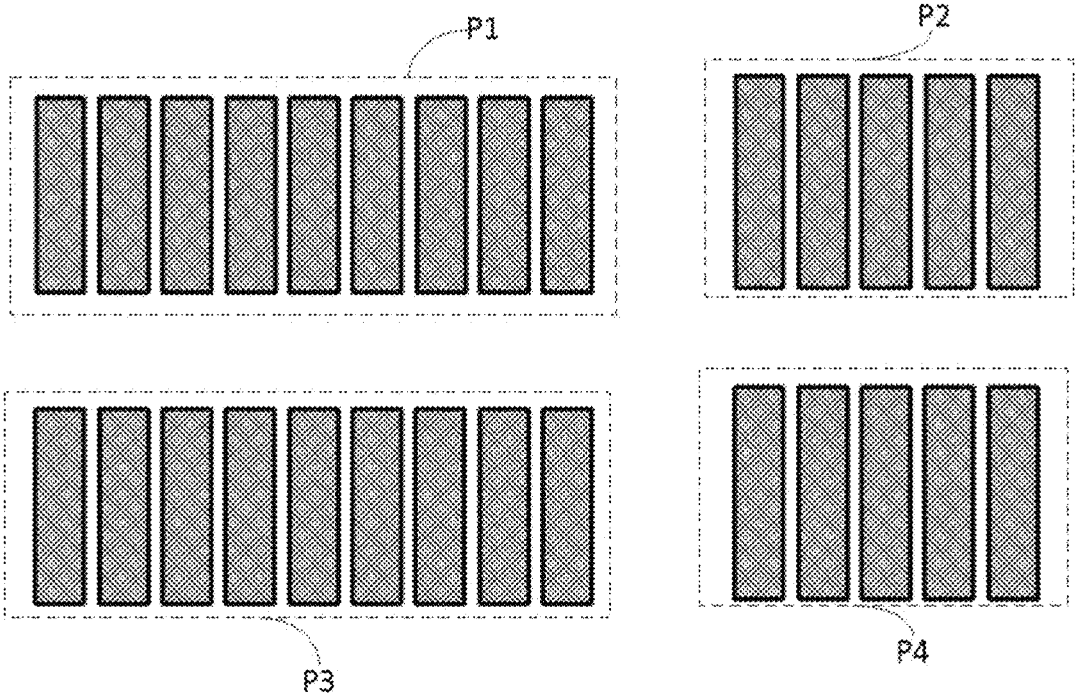
FIG. 16 is a layout diagram of the semiconductor layer in FIG. 14.

In FIG. 16, the one labeled P1 is the active layer pattern of M1, the one labeled P2 is the active layer pattern of M2, the one labeled P3 is the active layer pattern of M3, and the one labeled P4 is the active layer pattern of M4.

FIG. 15 is a layout diagram of the first gate metal layer in FIG. 14, FIG. 16 is a layout diagram of the semiconductor layer in FIG. 14, and FIG. 17 is a layout diagram of the first source-drain metal layer in FIG. 14.

As shown in FIG. 14, there is a first first overlapping portion between the orthographic projection of DX11 on the base substrate and the orthographic projection of GL0(2n) on the base substrate;

There is a first second overlapping portion between the orthographic projection of DX12 on the base substrate and the orthographic projection of GL0(2n) on the base substrate;

The first first overlapping portion and the first second overlapping portion are independent of each other;

There is a first third overlap between the orthographic projection of DX13 on the base substrate and the orthographic projection of GL0(2n) on the base substrate;

There is a first fourth overlapping portion between the orthographic projection of DX14 on the base substrate and the orthographic projection of GL0(2n) on the base substrate;

the first third overlapping portion and the first fourth overlapping portion are independent of each other;

There is a second third overlapping portion between the orthographic projection of DX13 on the base substrate and the orthographic projection of GL1(2n) on the base substrate;

There is a second fourth overlapping portion between the orthographic projection of DX14 on the base substrate and the orthographic projection of GL1(2n) on the base substrate;

The second third overlapping portion and the second fourth overlapping portion are independent of each other.

Figure 18:
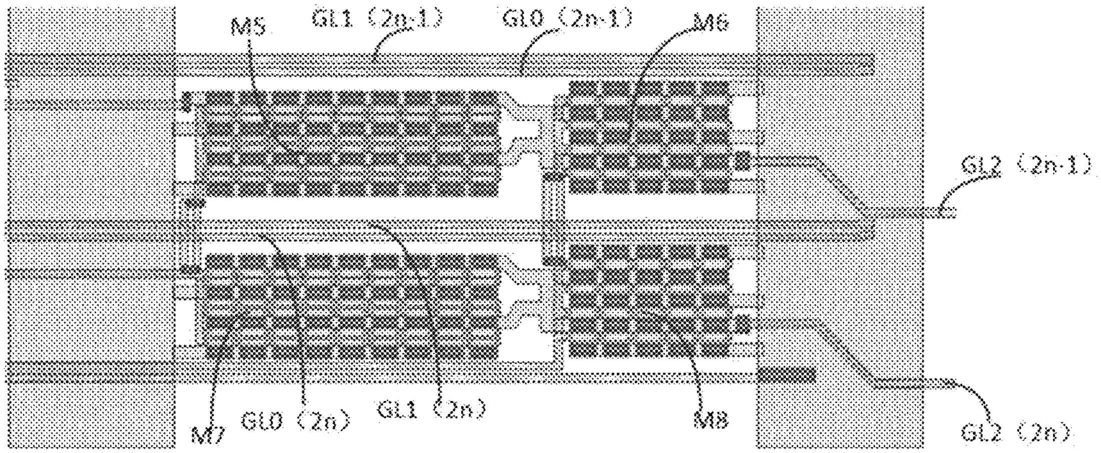
FIG. 18 is a schematic diagram of the overlapping relationship between the connection line between the fifth output transistor M5 and the seventh output transistor M7, the connection line between the sixth output transistor M6 and the eighth output transistor M8, and the scanning line.
Figure 19:
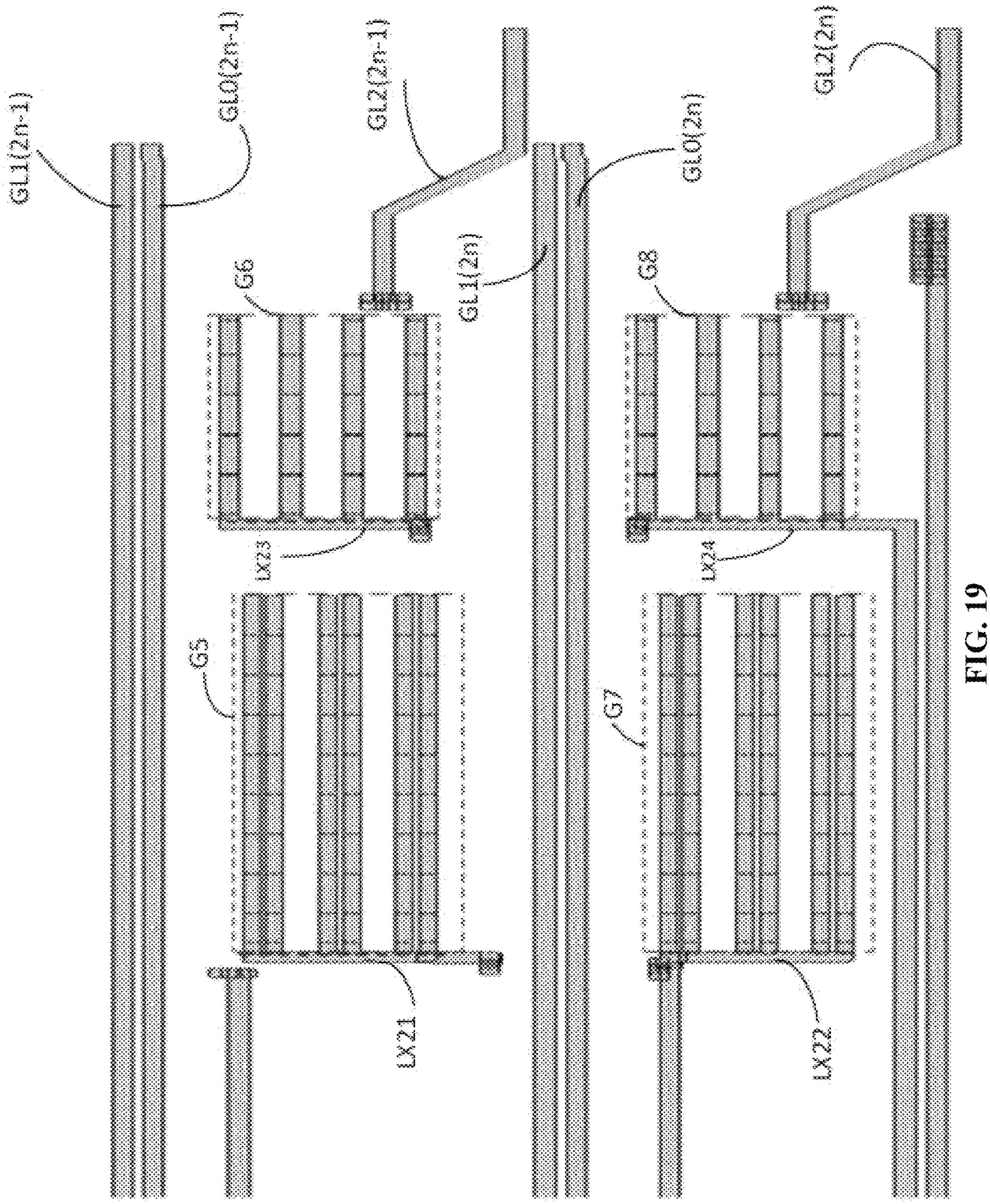
FIG. 19 is a layout diagram of the first gate metal layer in FIG. 18.

In FIG. 18, the one labeled M5 is the fifth output transistor, the one labeled M6 is the sixth output transistor, the one labeled M7 is the seventh output transistor, and the one labeled M8 is the eighth output transistor;

In FIG. 18 and FIG. 19, the one labeled GL0 (2n−1) is the shift scanning line of the (2n−1)th row; the one labeled GL1 (2n−1) is the first scanning line of the (2n−1)th row, the one labeled GL2 (2n−1) is the second scanning line of the (2n−1)th row;

The one labeled GL0 (2n) is the shift scanning line of the 2nth row, the one labeled GL1 (2n) is the first scanning line of the 2nth row, and the one labeled GL2 (2n) is the second scanning line of the 2nth row.

In FIG. 19, the one labeled G5 is the gate electrode of M5, the one labeled G6 is the gate electrode of M6, the one labeled G7 is the gate electrode of M7, and the one labeled G8 is the gate electrode of M8;

In FIG. 19, the one labeled LX21 is the second first connection line part, and the one labeled LX22 is the second second connection line part;

The one labeled LX23 is the second third connection line part, and the one labeled LX24 is the second fourth connection line part.

Figure 21:
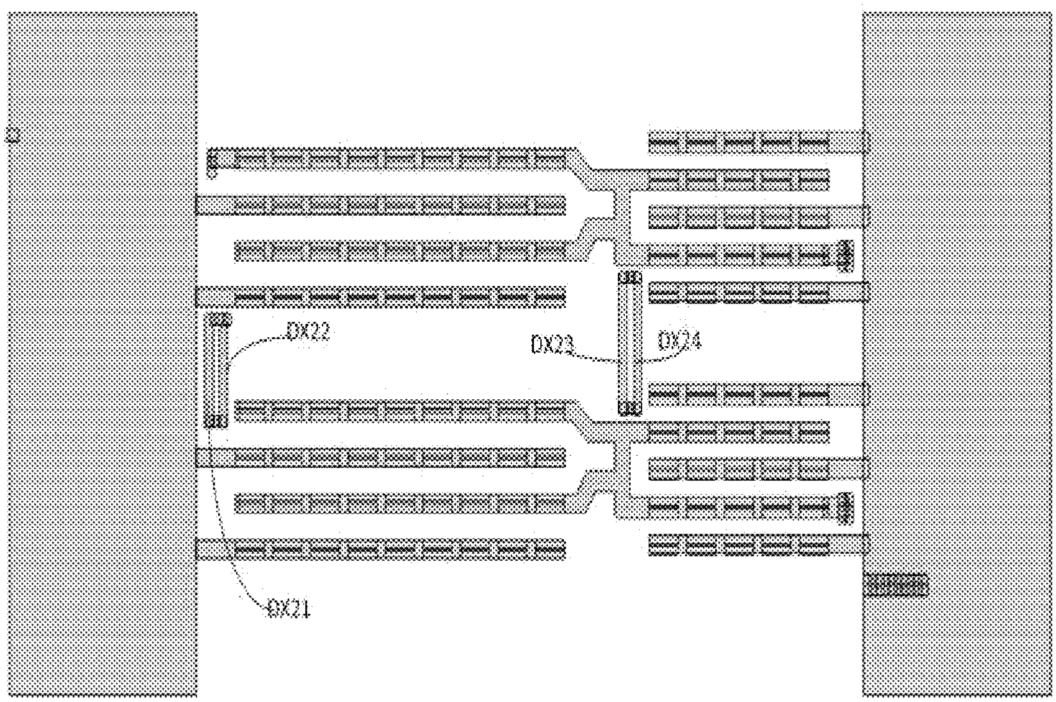
FIG. 21 is a layout diagram of the first source-drain metal layer in FIG. 18.

In FIG. 21, the one labeled DX21 is the second first conducting line, and the one labeled DX22 is the second second conducting line;

The one labeled DX23 is the second third conducting line, and the one labeled DX24 is the second third conducting line.

Figure 20:
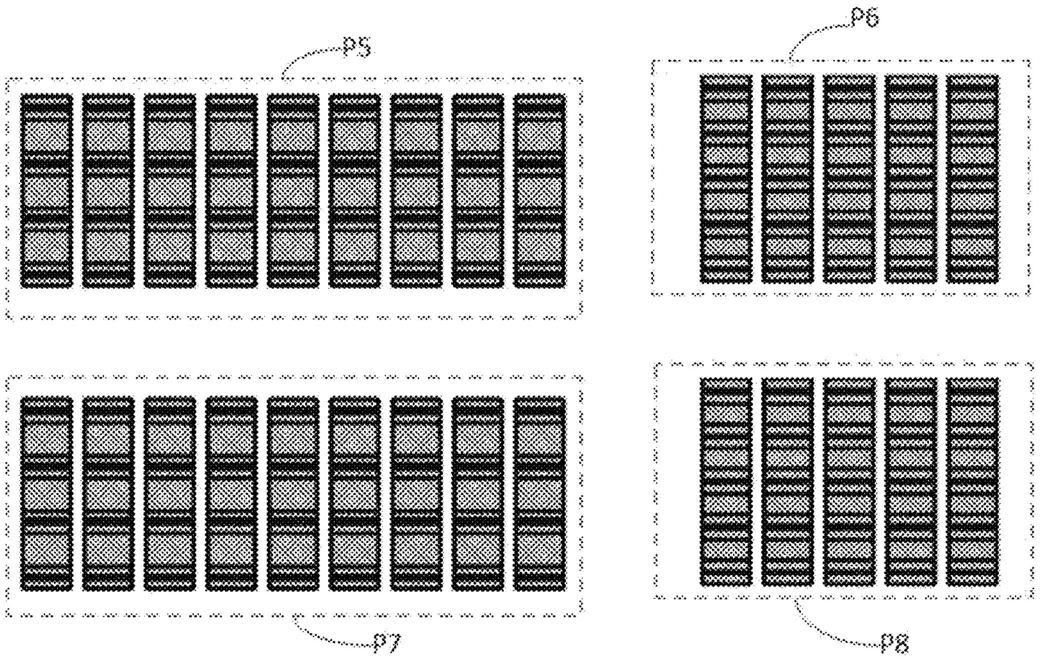
FIG. 20 is a layout diagram of the semiconductor layer in FIG. 18.

In FIG. 20, the one labeled P5 is the active layer pattern of M5, the one labeled P6 is the active layer pattern of M6, the one labeled P7 is the active layer pattern of M7, and the one labeled P8 is the active layer pattern of M8.

FIG. 19 is a layout diagram of the first gate metal layer in FIG. 18, FIG. 20 is a layout diagram of the semiconductor layer in FIG. 18, and FIG. 21 is a layout diagram of the first source-drain metal layer in FIG. 18.

As shown in FIG. 18, there is a second first overlapping portion between the orthographic projection of DX21 on the base substrate and the orthographic projection of GL0(2n) on the base substrate;

There is a second second overlapping portion between the orthographic projection of DX22 on the base substrate and the orthographic projection of GL0(2n) on the base substrate;

The second first overlapping portion and the second second overlapping portion are independent from each other;

There is a third first overlapping portion between the orthographic projection of DX21 on the base substrate and the orthographic projection of GL1(2n) on the base substrate;

There is a third second overlapping portion between the orthographic projection of DX22 on the base substrate and the orthographic projection of GL1(2n) on the base substrate;

The third second overlapping portion and the third first overlapping portion are independent from each other;

There is a third third overlapping portion between the orthographic projection of DX23 on the base substrate and the orthographic projection of GL0(2n) on the base substrate;

There is a third fourth overlapping portion between the orthographic projection of DX24 on the base substrate and the orthographic projection of GL0(2n) on the base substrate;

The third third overlapping portion and the third fourth overlapping portion are independent of each other;

There is a fourth third overlapping portion between the orthographic projection of DX23 on the base substrate and the orthographic projection of GL1(2n) on the base substrate;

There is a fourth fourth overlapping portion between the orthographic projection of DX24 on the base substrate and the orthographic projection of GL1(2n) on the base substrate;

The fourth third overlapping portion and the fourth fourth overlapping portion are independent from each other.

Figure 22:
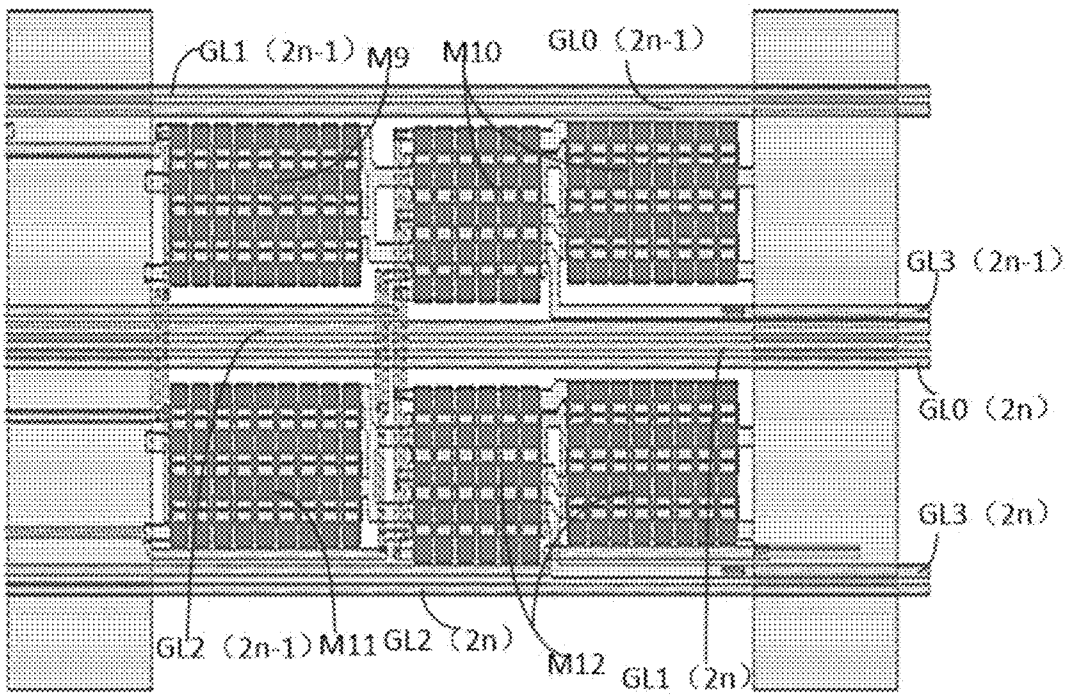
FIG. 22 is a schematic diagram of the overlapping relationship between the connection line between the ninth output transistor M9 and the eleventh output transistor M11, the connection line between the tenth output transistor M10 and the twelfth output transistor M12, and the scanning line.
Figure 23:
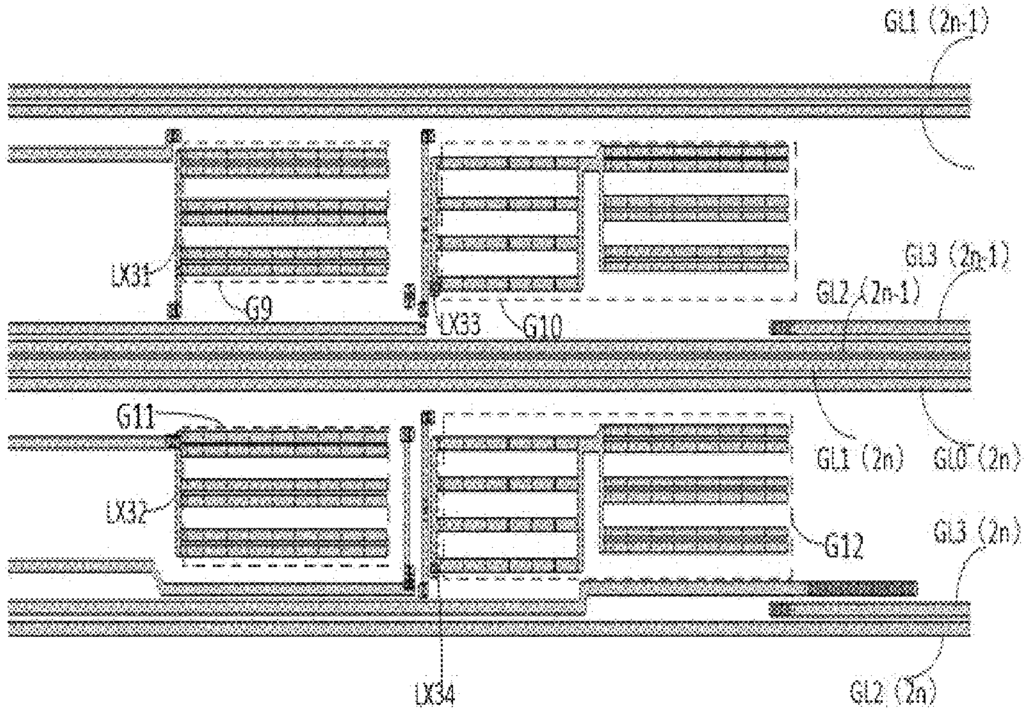
FIG. 23 is a layout diagram of the first gate metal layer in FIG. 22.

In FIG. 22, the one labeled M9 is the ninth output transistor, the one labeled M10 is the tenth output transistor, the one labeled M11 is the eleventh output transistor, and the one labeled M12 is the twelfth output transistor;

In FIG. 22 and FIG. 23, the one labeled GL0 (2n−1) is the shift scanning line of the (2n−1)th row; the one labeled GL1 (2n−1) is the first scanning line of the (2n−1)th row, the one labeled GL2 (2n−1) is the second scanning line of the (2n−1)th row; the one labeled GL3 (2n−1) is the third scanning line of the (2n−1)th row;

The one labeled GL0 (2n) is the shift scanning line ofthe 2nth of row, the one labeled GL1 (2n) is the first scanning line of the 2nth of row, and the one labeled GL2 (2n) is the second scanning line of the 2nth of row, the one labeled GL3 (2n) is the third scanning line of the 2nth row.

In FIG. 23, the one labeled G9 is the gate electrode of M9, the one labeled G10 is the gate electrode of M10, the one labeled GI1 is the gate electrode of M11, and the one labeled G12 is the gate electrode of M12;

In FIG. 23, the one labeled LX31 is the third first connection line part, and the one labeled LX32 is the third second connection line part;

The one labeled LX33 is the third third connection line part, and the one labeled LX34 is the third fourth connection line part.

Figure 25:
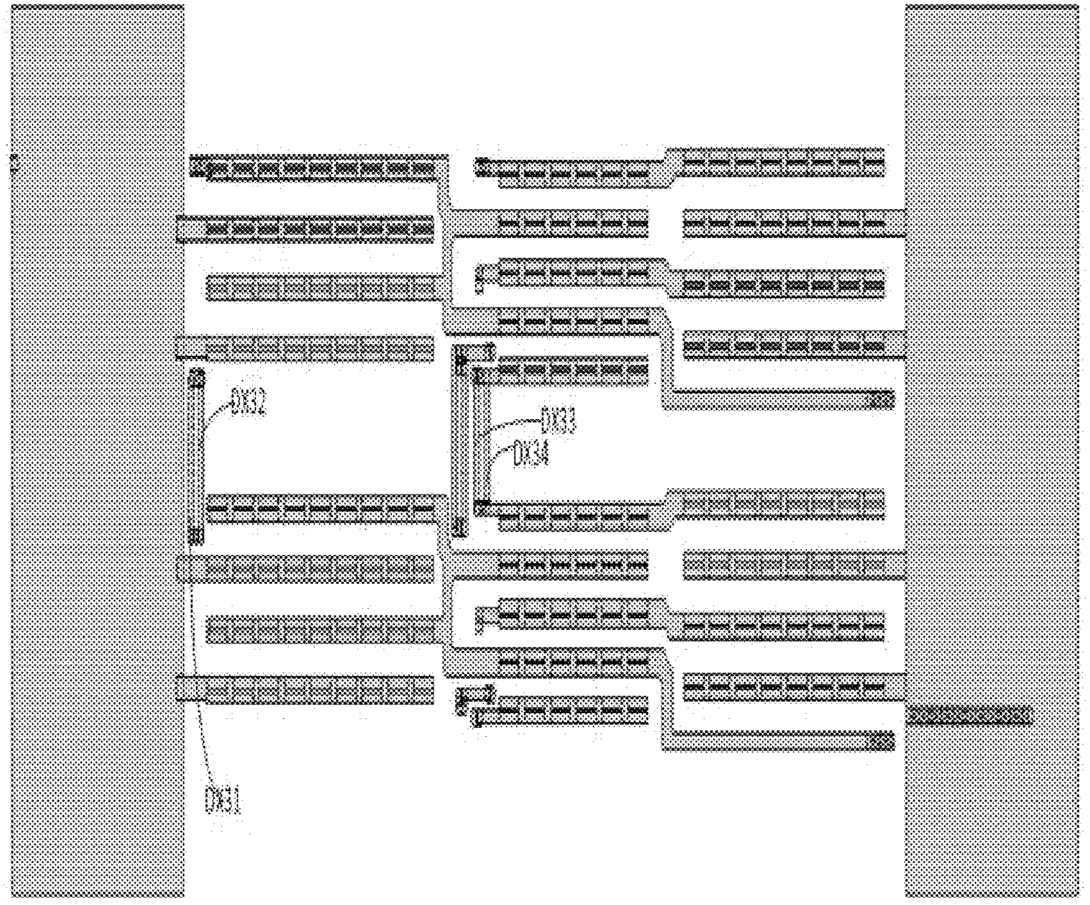
FIG. 25 is a layout diagram of the first source-drain metal layer in FIG. 22.

In FIG. 25, the one labeled DX31 is the third first conducting line, and the one labeled DX32 is the third second conducting line;

The one labeled DX33 is the third third conducting line, and the one labeled DX34 is the third fourth conducting line.

Figure 24:
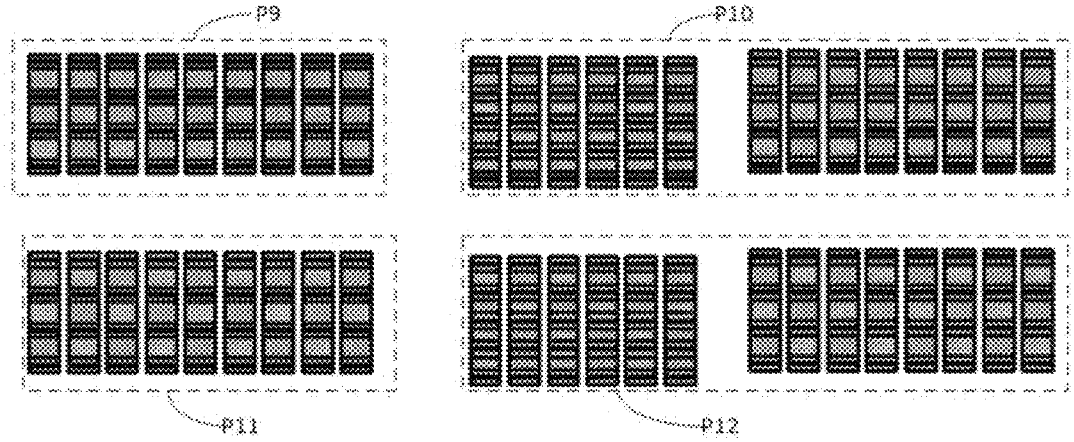
FIG. 24 is a layout diagram of the semiconductor layer in FIG. 22.

In FIG. 24, the one labeled P9 is the active layer pattern of M9, the one labeled P10 is the active layer pattern of M10, the one labeled P11 is the active layer pattern of M11, and the one labeled P12 is the active layer pattern of M12.

FIG. 23 is a layout diagram of the first gate metal layer in FIG. 22, FIG. 24 is a layout diagram of the semiconductor layer in FIG. 22, and FIG. 25 is a layout diagram of the first source-drain metal layer in FIG. 22.

As shown in FIG. 22, there is a fourth first overlapping portion between the orthographic projection of DX31 on the base substrate and the orthographic projection of GL0(2n) on the base substrate;

There is a fourth second overlapping portion between the orthographic projection of DX32 on the base substrate and the orthographic projection of GL0(2n) on the base substrate;

The fourth first overlapping portion and the fourth second overlapping portion are independent from each other;

There is a fifth first overlapping portion between the orthographic projection of DX31 on the base substrate and the orthographic projection of GL1(2n) on the base substrate;

There is a fifth second overlapping portion between the orthographic projection of DX32 on the base substrate and the orthographic projection of GL1(2n) on the base substrate;

The fifth first overlapping portion and the fifth second overlapping portion are independent from each other;

There is a sixth first overlapping portion between the orthographic projection of DX31 on the base substrate and the orthographic projection of GL2(2n) on the base substrate;

There is a sixth second overlapping portion between the orthographic projection of DX32 on the base substrate and the orthographic projection of GL2(2n) on the base substrate;

The sixth first overlapping portion and the sixth second overlapping portion are independent from each other;

There is a fifth third overlapping portion between the orthographic projection of DX33 on the base substrate and the orthographic projection of GL0(2n) on the base substrate;

There is a fifth fourth overlapping portion between the orthographic projection of DX34 on the base substrate and the orthographic projection of GL0(2n) on the base substrate;

The fifth third overlapping portion and the fifth fourth overlapping portion are independent of each other;

There is a sixth third overlapping portion between the orthographic projection of DX33 on the base substrate and the orthographic projection of GL1(2n) on the base substrate;

There is a sixth fourth overlapping portion between the orthographic projection of DX34 on the base substrate and the orthographic projection of GL1(2n) on the base substrate;

The sixth third overlapping portion and the sixth fourth overlapping portion are independent from each other;

There is a seventh third overlapping portion between the orthographic projection of DX33 on the base substrate and the orthographic projection of GL2(2n) on the base substrate;

There is a seventh fourth overlapping portion between the orthographic projection of DX34 on the base substrate and the orthographic projection of GL2(2n) on the base substrate;

The seventh third overlapping portion and the seventh fourth overlapping portion are independent of each other.

Figure 26:
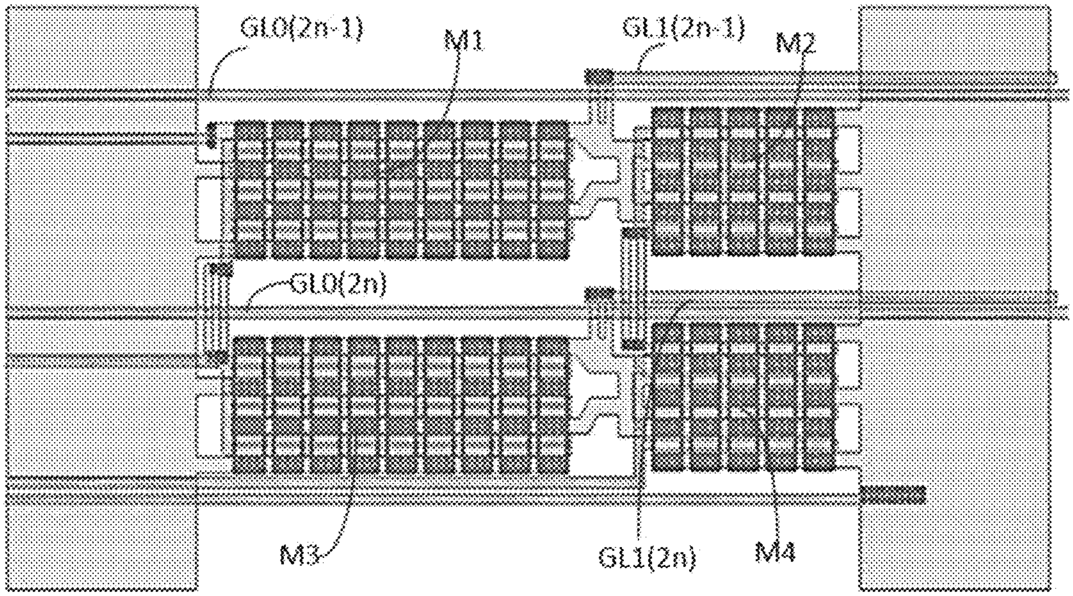
FIG. 26 is a schematic diagram of the overlapping relationship between the connection line between the first output transistor M1 and the third output transistor M3, the connection line between the second output transistor M2 and the fourth output transistor M4, and the scanning line.
Figure 27:
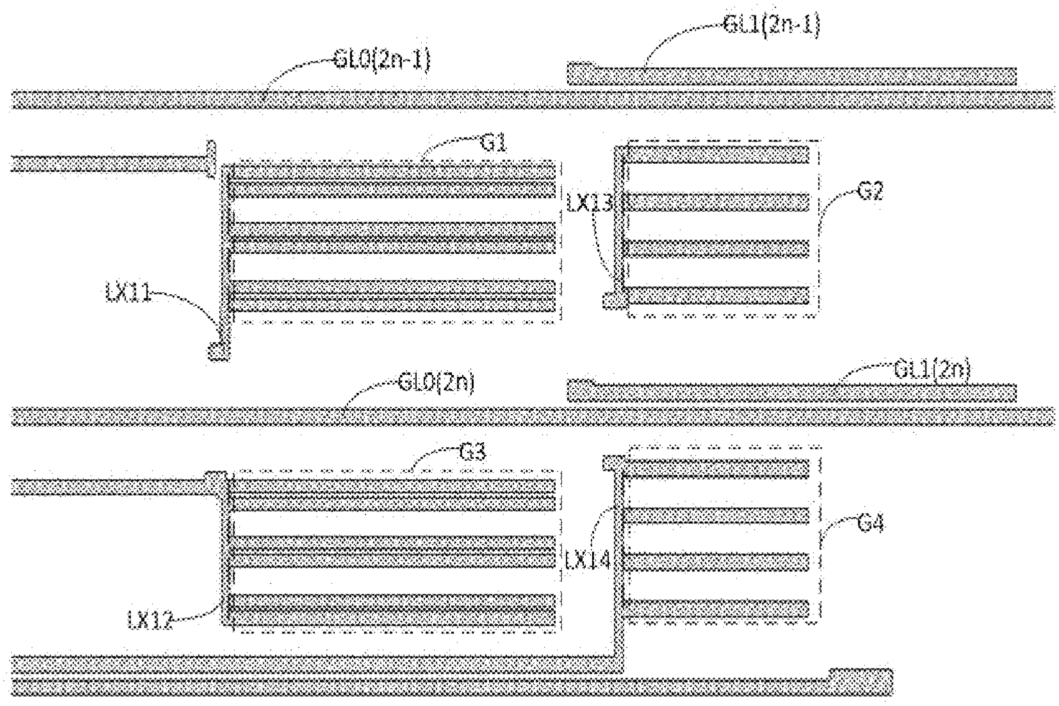
FIG. 27 is a layout diagram of the first gate metal layer in FIG. 26.

In FIG. 26, the one labeled M1 is the first output transistor, the one labeled M3 is the second output transistor, the one labeled M2 is the third output transistor, and the one labeled M4 is the fourth output transistor;

In FIG. 26 and FIG. 27, the one labeled GL0 (2n−1) is the shift scanning line of the (2n−1)th row; the one labeled GL1 (2n−1) is the first scanning line of the (2n−1)th row;

The one labeled GL0 (2n) is the shift scanning line of the 2nth row, and the one labeled GL1 (2n) is the first scanning line of the 2nth row.

In FIG. 27, the one labeled G1 is the gate electrode of M1, the one labeled G2 is the gate electrode of M2, the one labeled G3 is the gate electrode of M3, and the one labeled G4 is the gate electrode of M4;

In FIG. 27, the one labeled LX11 is the first first connection line part, and the one labeled LX12 is the first second connection line part;

The one labeled LX13 is the first third connection line part, and the one labeled LX14 is the first fourth connection line part.

Figure 29:
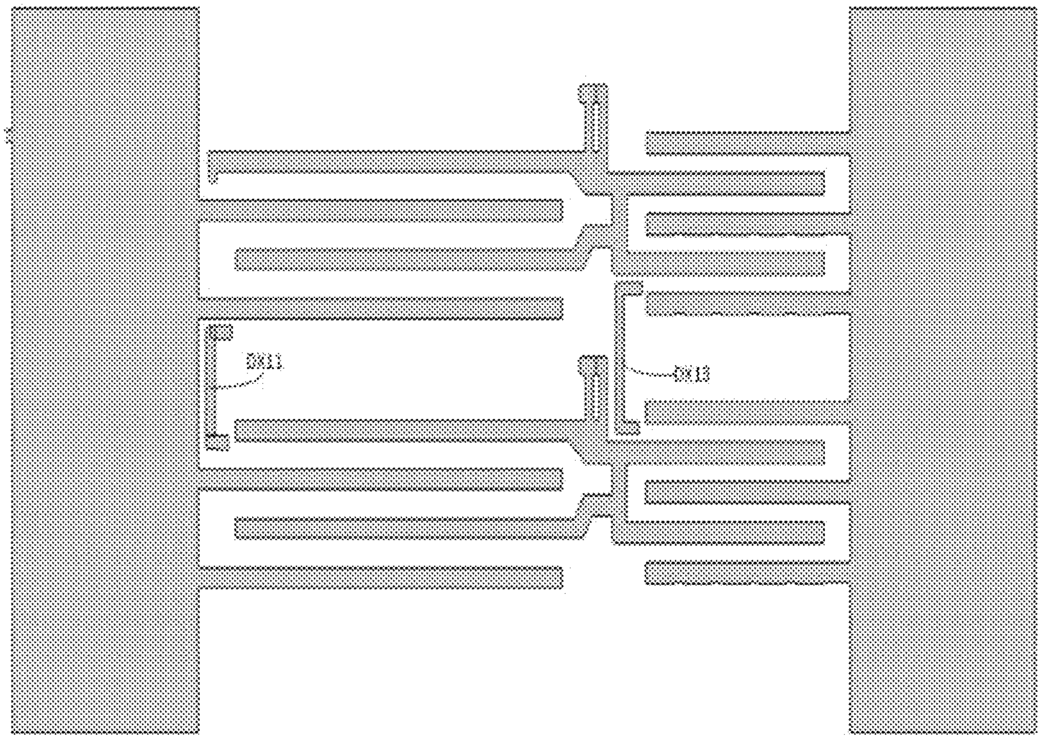
FIG. 29 is a layout diagram of the first source-drain metal layer in FIG. 26.
Figure 30:
FIG. 30 is a layout diagram of the second source-drain metal layer in FIG. 26.

In FIG. 29, the one labeled DX11 is the first first conducting line, and in FIG. 30, the one labeled DX12 is the first second conducting line;

In FIG. 29, the one labeled DX13 is the first third conducting line, and in FIG. 30, the one labeled DX14 is the first third conducting line.

Figure 28:
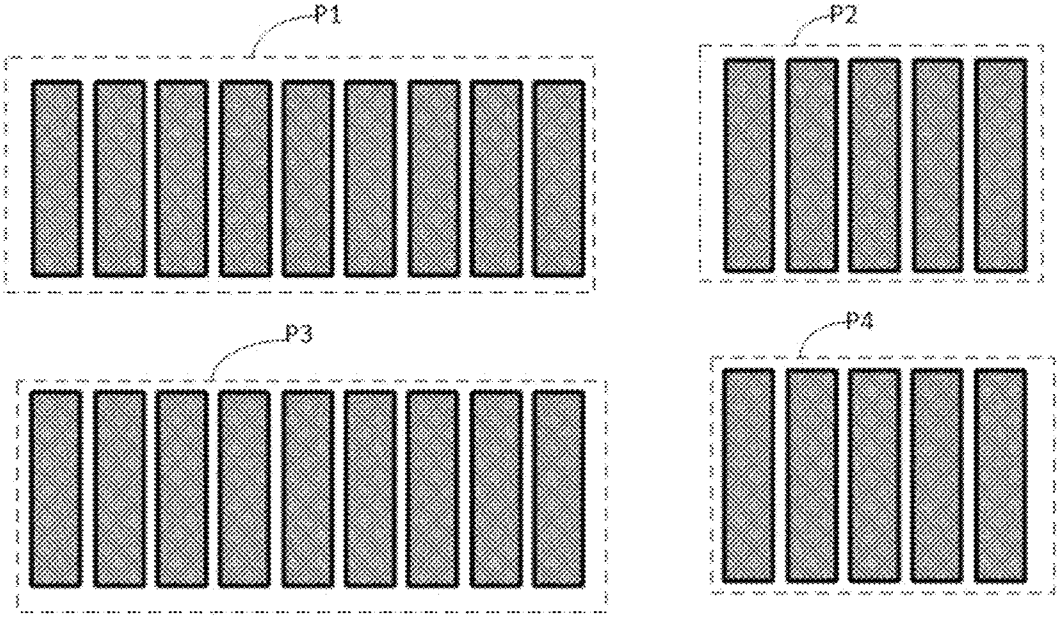
FIG. 28 is a layout diagram of the semiconductor layer in FIG. 26.

In FIG. 28, the one labeled P1 is the active layer pattern of M1, the one labeled P2 is the active layer pattern of M2, the one labeled P3 is the active layer pattern of M3, and the one labeled P4 is the active layer pattern of M4.

FIG. 27 is a layout diagram of the first gate metal layer in FIG. 26, FIG. 28 is a layout diagram of the semiconductor layer in FIG. 26, FIG. 29 is a layout diagram of the first source-drain metal layer in FIG. 26, FIG. 30 is a layout diagram of the second source-drain metal layer in FIG. 26.

As shown in FIG. 26, there is a first first overlapping portion between the orthographic projection of DX11 on the base substrate and the orthographic projection of GL0(2n) on the base substrate;

There is a first second overlapping portion between the orthographic projection of DX12 on the base substrate and the orthographic projection of GL0(2n) on the base substrate;

The first first overlapping portion and the first second overlapping portion are independent of each other;

There is a first third overlapping portion between the orthographic projection of DX13 on the base substrate and the orthographic projection of GL0(2n) on the base substrate;

There is a first fourth overlapping portion between the orthographic projection of DX14 on the base substrate and the orthographic projection of GL0(2n) on the base substrate;

The first third overlapping portion and the first fourth overlapping portion are independent of each other;

There is a second third overlapping portion between the orthographic projection of DX13 on the base substrate and the orthographic projection of GL1(2n) on the base substrate;

There is a second fourth overlapping portion between the orthographic projection of DX14 on the base substrate and the orthographic projection of GL1(2n) on the base substrate;

The second third overlapping portion and the second fourth overlapping portion are independent of each other.

Figure 31:
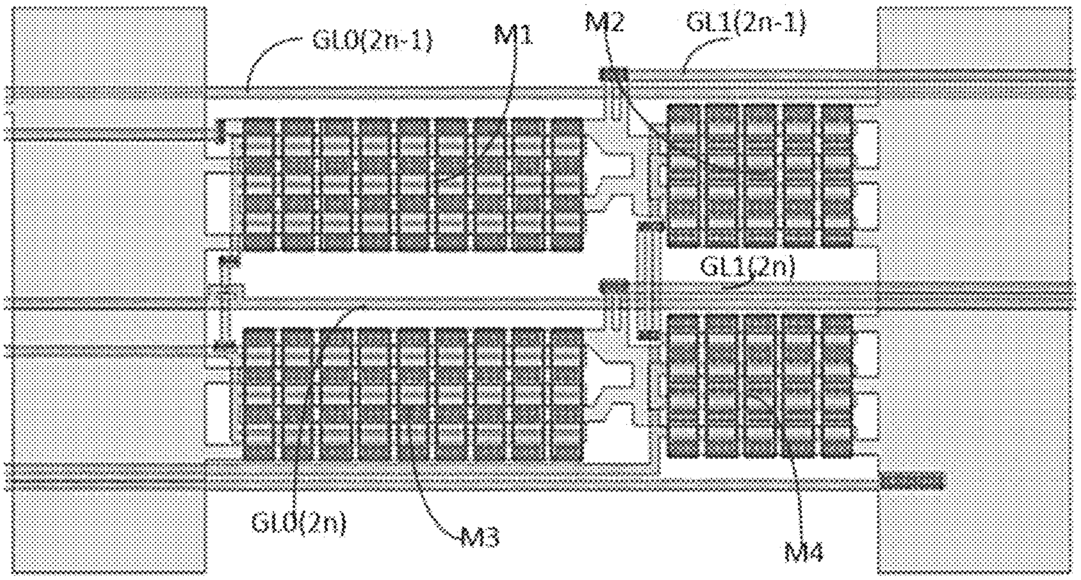
FIG. 31 is a schematic diagram of the overlapping relationship between the connection line between the first output transistor M1 and the third output transistor M3, the connection line between the second output transistor M2 and the fourth output transistor M4, and the scanning line.
Figure 32:
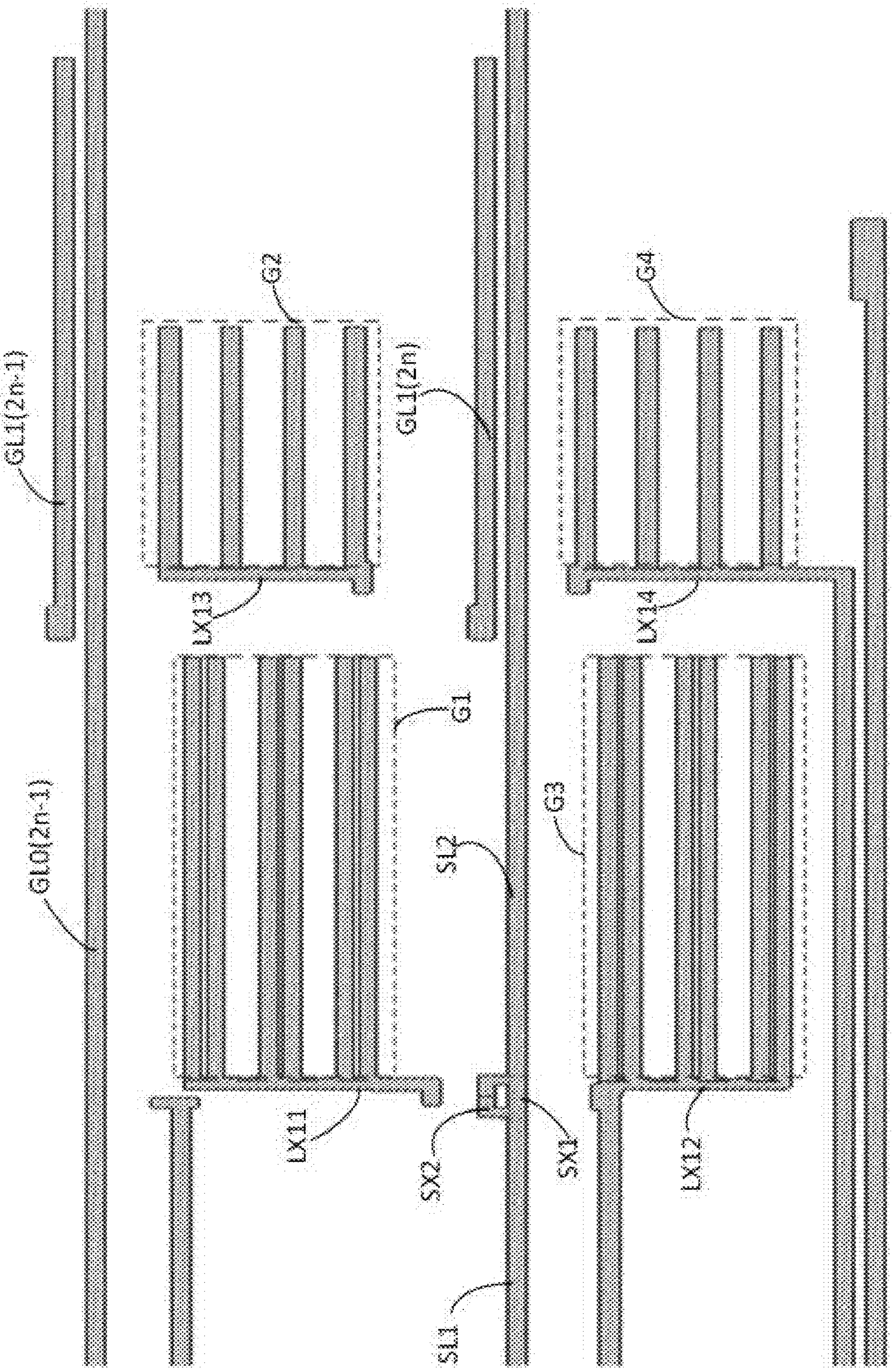
FIG. 32 is a layout diagram of the first gate metal layer in FIG. 31.

In FIG. 31, the one labeled M1 is the first output transistor, the one labeled M3 is the second output transistor, the one labeled M2 is the third output transistor, and the one labeled M4 is the fourth output transistor;

In FIG. 31 and FIG. 32, the one labeled GL0 (2n−1) is the shift scanning line of the (2n−1)th row; the one labeled GL1 (2n−1) is the first scanning line of the (2n−1)th row;

In FIG. 31, the one labeled GL0 (2n) is the shift scanning line of the 2nth row, and in FIGS. 31 and 32, the one labeled GL1 (2n) is the first scanning line of the 2nth row.

In FIG. 32, the one labeled G1 is the gate electrode of M1, the one labeled G2 is the gate electrode of M2, the one labeled G3 is the gate electrode of M3, and the one labeled G4 is the gate electrode of M4;

In FIG. 32, the one labeled LX11 is the first first connection line part, and the one labeled LX12 is the first second connection line part;

The one labeled LX13 is the first third connection line part, and the one labeled LX14 is the first fourth connection line part.

Figure 34:
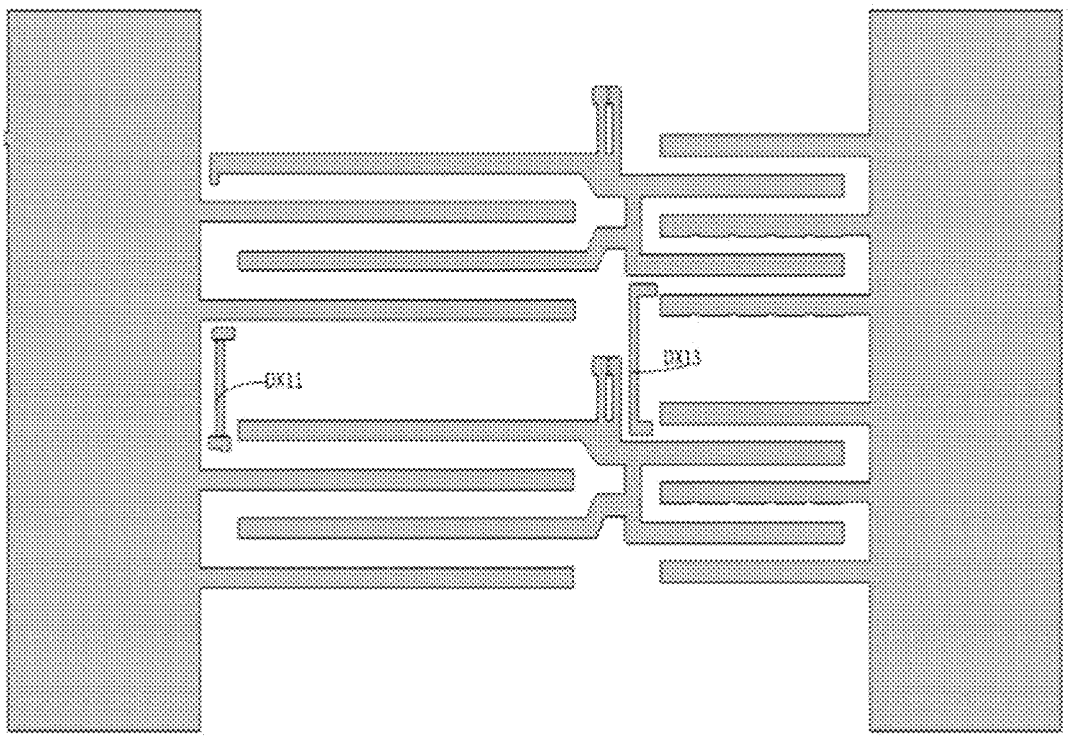
FIG. 34 is a layout diagram of the first source-drain metal layer in FIG. 31.
Figure 35:
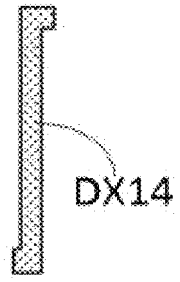
FIG. 35 is a layout diagram of the second source-drain metal layer in FIG. 31.

In FIG. 24, the one labeled as DX11 is the first first conducting line;

In FIG. 34, the one labeled DX13 is the first third conducting line, and in FIG. 35, the one labeled DX14 is the first fourth conducting line.

In FIG. 32, GL0 (2n) includes the first scanning connection line SL1, the first scanning line part SX1, the second scanning line part SX2 and the second scanning connection line SL2;

The first scanning line part SX1 and the second scanning connection line SL2 are connected in parallel.

Figure 33:
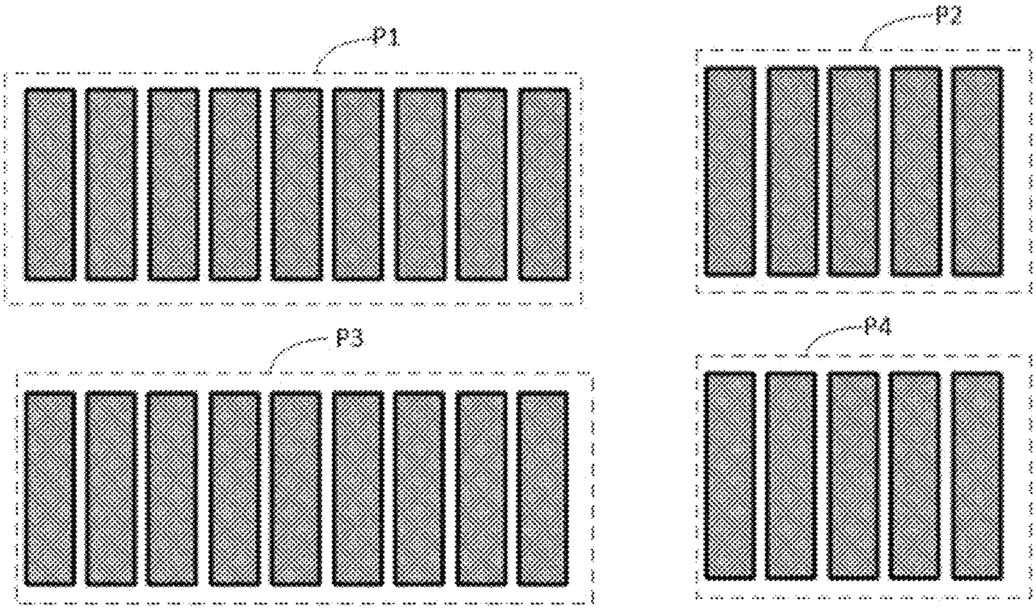
FIG. 33 is a layout diagram of the semiconductor layer in FIG. 31.

In FIG. 33, the one labeled P1 is the active layer pattern of M1, the one labeled P2 is the active layer pattern of M2, the one labeled P3 is the active layer pattern of M3, and the one labeled P4 is the active layer pattern of M4.

FIG. 32 is a layout diagram of the first gate metal layer in FIG. 31, FIG. 33 is a layout diagram of the semiconductor layer in FIG. 31, FIG. 34 is a layout diagram of the first source-drain metal layer in FIG. 31, FIG. 35 is a layout diagram of the second source-drain metal layer in FIG. 31.

As shown in FIG. 31, there is a first fifth overlapping portion between the orthographic projection of DX11 on the base substrate and the orthographic projection of SX1 on the base substrate;

There is a first sixth overlapping portion between the orthographic projection of DX11 on the base substrate and the orthographic projection of SX2 on the base substrate;

The first fifth overlapping portion and the first sixth overlapping portion are independent from each other;

There is a first third overlapping portion between the orthographic projection of DX13 on the base substrate and the orthographic projection of GL0(2n) on the base substrate;

There is a first fourth overlapping portion between the orthographic projection of DX14 on the base substrate and the orthographic projection of GL0(2n) on the base substrate;

The first third overlapping portion and the first fourth overlapping portion are independent of each other;

There is a second third overlapping portion between the orthographic projection of DX13 on the base substrate and the orthographic projection of GL1(2n) on the base substrate;

There is a second fourth overlapping portion between the orthographic projection of DX14 on the base substrate and the orthographic projection of GL1(2n) on the base substrate;

The second third overlapping portion and the second fourth overlapping portion are independent of each other.

In at least one embodiment of the present disclosure, the display substrate may include a semiconductor layer Poly, a first gate metal layer GT1, a second gate metal layer GT2, a first source-drain metal layer SD1, a second source-drain metal layer SD2 and an anode layer AN that are arranged in sequence along the direction away from the base substrate;

An interlayer dielectric layer ILD may be arranged between the second gate metal layer GT2 and the first source-drain metal layer SD1, and a first organic insulating layer RS1 and a first passivation layer PVX1 may be arranged between the first source-drain metal layer SD1 and the second source-drain metal layer SD2;

A second passivation layer PVX2 and a second organic insulating layer RS2 are arranged between the second source-drain metal layer SD2 and the anode layer AN.

A first pixel defining layer PDL1 and a second pixel defining layer PDL2 are arranged in sequence on the side of the anode layer AN away from the base substrate.

Figure 36:
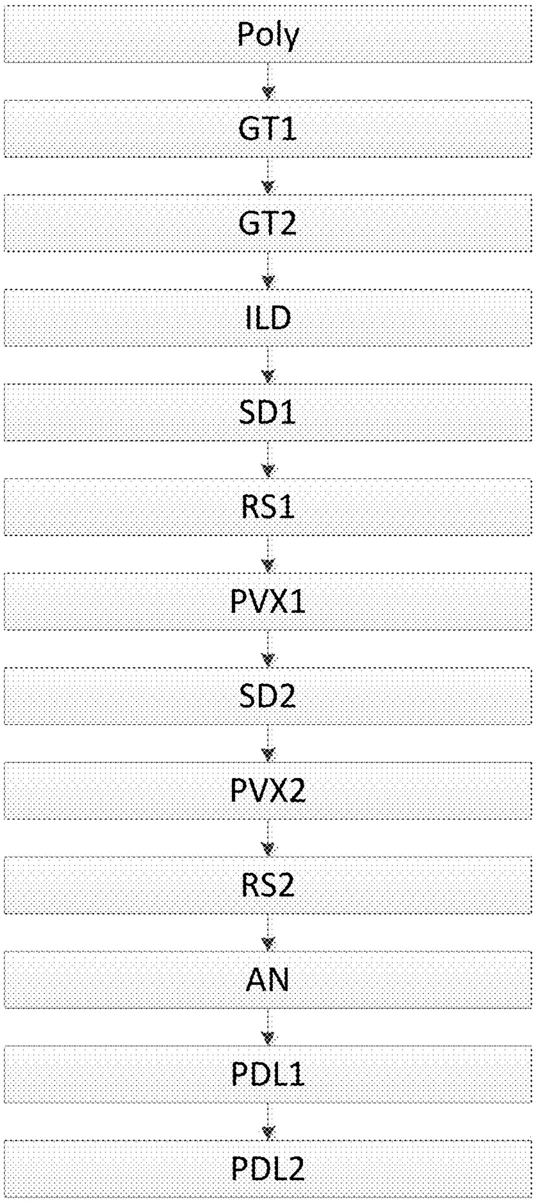
FIG. 36 is a flow chart of a process manufacturing the display substrate according to at least one embodiment of the present disclosure.

In at least one embodiment of the present disclosure, as shown in FIG. 36, the process flow can be Poly-GT1-GT2-ILD-SD1-RS1-PVX1-SD2-RS2-PVX2-AN-PDL1-PDL2, a total of 13 Masks process, but not limited to.

After manufacturing the display substrate according to at least one embodiment of the present disclosure, a screen-on test is performed on the display substrate.

When performing a screen-on test, each row of pixel circuits is controlled to display images, and when a specific row of pixel circuits displays abnormally, a line detector is used to detect whether there is a short circuit between the corresponding row of scanning lines and the first connection line (the line detector can be, for example, an optical detection device), and when the line detector detects a short circuit between the corresponding row of scanning line and the first connection line, the corresponding row of scanning line or the first connection line is cut off, so that the corresponding row of scanning line is disconnected from the first connection line, and the corresponding row of scanning line can provide a corresponding row of scanning signal to the corresponding row of pixel circuit, and the first connection line can be electrically connected to the (2n−1)th stage of output circuit and the 2nth stage of output circuit.

In specific implementation, when the first connection line includes a first connection line part, a first conducting line, a second conducting line and a second connection line part, the line detector detects whether there is a short circuit between the first conducting line or the second conducting line and the corresponding row of scanning line; when the line detector detects a short circuit between the first conducting line and the corresponding row of scanning line, the first conducting line is cut off by laser, and then the (2n−1)th stage of output circuit and the 2nth stage of output circuit can also be electrically connected to each other through the second conducting line to share the first node; when the line detector detects that there is short circuit between the second conducting line and the corresponding row of scanning line, the second conducting line is cut off by laser, at this time, the (2n−1)th stage of output circuit and the 2nth stage of output circuit can also be electrically connected to each other through the first conducting line, so as to share the first node.

In specific implementation, when the scanning line includes a first scanning connection line, a first scanning line part, a second scanning line part and a second scanning connection line, the line detector detects whether there is a short circuit between the first scanning connection line or the second scanning connection line and the first connection line; when the line detector detects a short circuit between the first scanning connection line and the first connection line, the first scanning connection line is cut off by laser, at this time, the first scanning connection line can also be electrically connected to the second scanning connection line through the second scanning connection part, so that the corresponding row of scanning line can still provide corresponding scanning signal to the corresponding row of pixel circuits; when the line detector detects a short circuit between the second scanning connection line and the first connection line, the second scanning connection line is cut off by laser. At this time, the first scanning connection line can also be electrically connected to the second scanning connection line through the first scanning connection part, so that the scanning lines of the corresponding row can still provide the corresponding scanning signal to the pixel circuits of the corresponding row.

When performing a screen-on test, each row of pixel circuits is controlled to display images, and when a specific row of pixel circuits displays abnormally, a line detector is used to detect whether there is a short circuit between the corresponding row of scanning line and the second connection line (the line detector can be, for example, an optical detection device), and when the line detector detects a short circuit between the corresponding row of scanning line and the second connection line, the corresponding row of scanning line or the second connection line is cut off, so that the corresponding row of scanning line is disconnected from the second connection line, and the corresponding row of scanning line can provide a corresponding row of scanning signal to the corresponding row of pixel circuit, and the second connection line can be electrically connected to the (2n−1)th stage of output circuit and the 2nth stage of output circuit.

In specific implementation, when the second connection line includes a third connection line part, a third conducting line, a fourth conducting line and a fourth connection line part, the line detector detects whether there is a short circuit between the third conducting line or the fourth conducting line and the corresponding row scanning line; when the line detector detects a short circuit between the third conducting line and the corresponding row of scanning line, the third conducting line is cut off by laser, and then the (2n−1)th stage of output circuit and the 2nth stage of output circuit may also be electrically connected to each other through the fourth conducting line to share the second node; when the line detector detects that the short circuit between the fourth conducting line and the corresponding row of scanning line, the fourth conducting line is cut off by laser, at this time, the (2n−1)th stage of output circuit and the 2nth stage of output circuit can also be electrically connected to each other through the third conducting line to share the first node.

In specific implementation, when the scanning line includes a third scanning connection line, a third scanning line part, a fourth scanning line part and a fourth scanning connection line, the line detector detects whether there is a short circuit between the third scanning connection line or the fourth scanning connection line and the second connection line; when the line detector detects a short circuit between the third scanning connection line and the second connection line, the third scanning connection line is cut off by laser, at this time, the third scanning connection line can also be electrically connected to the fourth scanning connection line through the fourth scanning connection part, so that the corresponding row of scanning line can still provide corresponding scanning signal to the corresponding row of pixel circuits; when the line detector detects a short circuit between the fourth scanning connection line and the second connection line, the fourth scanning connection line is cut off by laser, and at this time, the third scanning connection line can also be electrically connected to the fourth scanning connection line through the third scanning connection part, so that the scanning line of the corresponding row can still provide corresponding scanning signal to the pixel circuits of the corresponding row.

The maintenance method of the display substrate described in the embodiments of the present disclosure is applied to the above-mentioned display substrate, and the maintenance method of the display substrate includes:

Performing a screen-on test on the display substrate, and controlling each row of pixel circuits to display an image;

When there is an abnormal display of the pixel circuit, detecting, by a line detector, whether there is a short circuit between a scanning line of a corresponding row and a first connection line;

When the line detector detects the short circuit between the scanning line of the corresponding row and the first connection line, cutting off the scanning line of the corresponding row from the first connection line, so that the scanning line of the corresponding row is disconnected from the first connection line, and the scanning line of the corresponding row provides a scanning signal of the corresponding row to the pixel circuits of the corresponding row, and the first connection line is electrically connected to the (2n−1)th stage of output circuit and the 2nth stage of output circuit.

In a specific implementation, the scanning line of the corresponding row is a scanning line electrically connected to a pixel circuit that displays an abnormality.

In at least one embodiment of the present disclosure, the nth stage of driving circuit further includes a second node control circuit; the (2n−1)th stage of output circuit is also electrically connected to the second node; the second node is electrically connected to the (2n−1)th stage of output circuit and the 2nth stage of output circuit through the second connection line; there are at least two independent overlapping portions between the orthographic projection of the second connection line on the base substrate and the orthographic projection of the scanning line on the base substrate; the maintenance method of the display substrate further includes:

When there is an abnormal display of the pixel circuit, detecting, by the line detector, whether there is a short circuit between the scanning line of the corresponding row and the second connection line;

When the line detector detects a short circuit between the scanning line of the corresponding row and the second connection line, cutting off the scanning line of the corresponding row or the second connection line, so that the scanning line of the corresponding row is disconnected from the second connection line, and the scanning line of the corresponding row can provide a scanning signal of the corresponding row to the pixel circuits of the corresponding row, and the second connection line is electrically connected to the (2n−1)th stage of output circuit and the 2nth stage of output circuit.

The display device described in the embodiment of the present disclosure includes the above-mentioned display substrate.

In at least one embodiment of the present disclosure, the display device may further include a plurality of rows and a plurality of columns of pixel circuits, the pixel circuits are arranged on the base substrate, and the pixel circuits are arranged in the display area.

Figure 37:
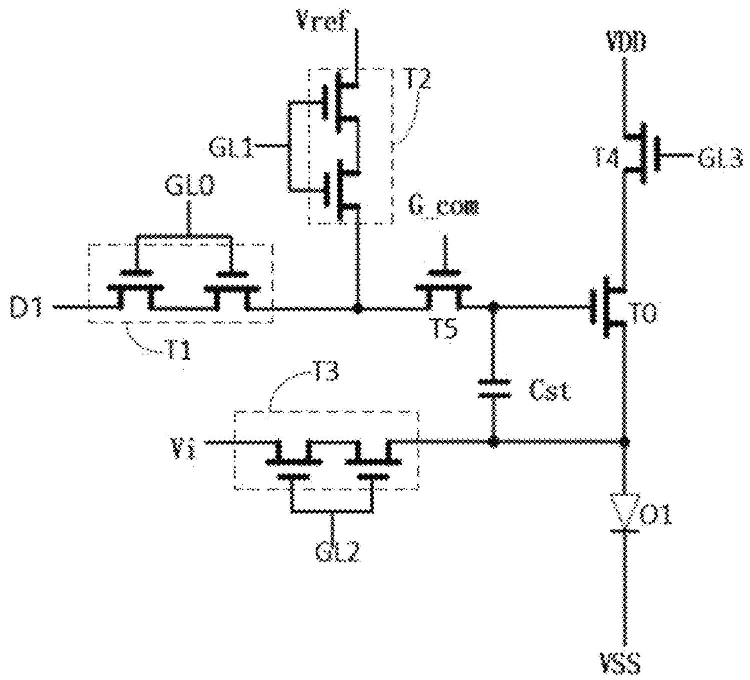
FIG. 37 is a circuit diagram of a pixel circuit in a display substrate according to at least one embodiment of the present disclosure.

As shown in FIG. 37, at least one embodiment of the pixel circuit may include an organic light emitting diode O1, a first display control transistor T1, a second display control transistor T2, a third display control transistor T3, a fourth display control transistor T4, a fifth display control transistor T5, a driving transistor TO and a storage capacitor Cst;

The gate electrode of T1 is electrically connected to the shift scanning line GL0, the source electrode of T1 is electrically connected to the data line D1, and the drain electrode of T1 is electrically connected to the drain electrode of T2;

The gate electrode of T2 is electrically connected to the first scanning line GL1, and the source electrode of T2 is connected to the reference voltage Vref;

The gate electrode of T3 is electrically connected to the second scanning line GL2, the source electrode of T3 is connected to the initialization voltage Vi, and the drain electrode of T3 is electrically connected to the anode of O1;

The gate electrode of T4 is electrically connected to the third scanning line GL3, the source electrode of T4 is connected to the high voltage VDD, and the drain electrode of T4 is electrically connected to the source electrode of TO;

The gate electrode of T5 is electrically connected to a partition control line G_com, the source electrode of T5 is electrically connected to the drain electrode of T1, and the drain electrode of T5 is electrically connected to the gate electrode of the driving transistor TO;

The first terminal of Cst is electrically connected to the gate electrode of TO, and the second terminal of Cst is electrically connected to the anode of O1;

The drain electrode of TO is electrically connected to the anode of O1, and the cathode of O1 is connected to the low voltage VSS.

In at least one embodiment of the pixel circuit shown in FIG. 37, all transistors are n-type transistors, but not limited thereto.

In at least one embodiment of the present disclosure, the shift scanning line may be a data writing-in control line, the first scanning line may be a first initial control line, and the second scanning line may be a second initial control line, the third scanning line may be a light emitting control line;

The shift scanning line is used to provide a shift scanning signal, the first scanning line is used to provide a first scanning signal, the second scanning line is used to provide a second scanning signal, and the third scanning line is used to provide a third scanning signal;

The third scanning signal provided by the third scanning line may be a light emitting control signal, but not limited thereto.

In at least one embodiment of the present disclosure, the shift scanning line is used to provide a shift scanning signal, and the Gate On Array (GOA) circuit that generates the shift scanning signal is a GOA circuit with a shift function;

The first driving unit that generates the first scanning signal, the second driving unit that generates the second scanning signal, and the third driving unit that generates the third scanning signal may be the GOA circuit having a Pulse Width Modulation (PWM) function. The GOA circuit with PWM function adopts the structure of sharing the first control node and the second control node, which can save the number of transistors, and is beneficial to realize the design of the narrow frame.

In specific implementation, the first driving circuit included in the first driving unit can be used to control the two stages of first driving output terminals to output corresponding first scanning signals under the control of the potential of the same first node of the potential of the same second node;

The second driving circuit included in the second driving unit can be used to control the two stages of second driving output terminals to respectively output corresponding second scanning signals under the control of the potential of the same first node and the potential of the same second node;

The third driving circuit included in the third driving unit can be used to control the two stages of third driving output terminals to respectively output corresponding third scanning signals under the control of the potential of the same first node and the potential of the same second node.

Figure 38:
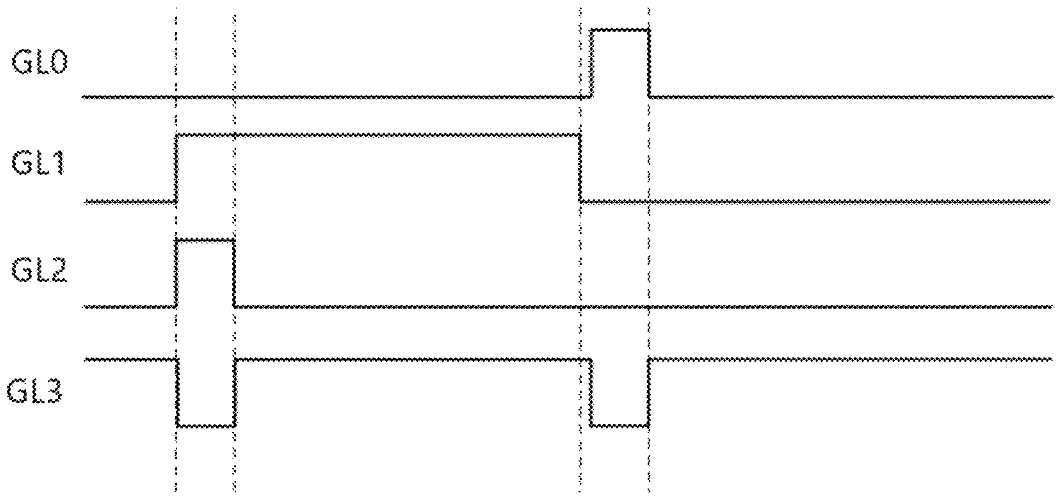
FIG. 38 is a working timing diagram of the pixel circuit shown in FIG. 37.

FIG. 38 is a working timing diagram of the pixel circuit shown in FIG. 37.

Figure 39:
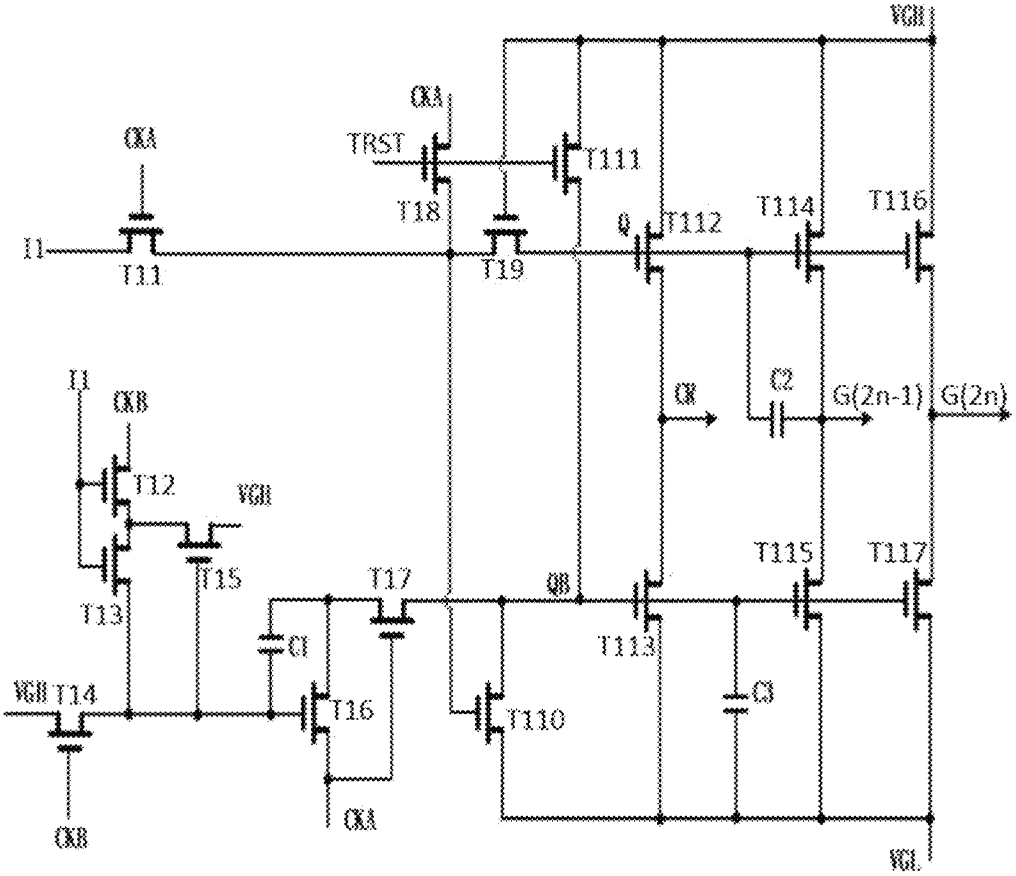
FIG. 39 is a circuit diagram of a driving circuit included in a driving unit having a PWM function.

As shown in FIG. 39, the driving circuit included in the driving unit with PWM function may include a first generation control transistor T11, a second generation control transistor T12, a third generation control transistor T13, a fourth generation control transistor T14, a fifth generation control transistor T15, a sixth generation control transistor T16, a seventh generation control transistor T17, an eighth generation control transistor T18, a ninth generation control transistor T19, a tenth generation control transistor T110, an eleventh generation control transistor T111, a twelfth generation control transistor T112, a thirteenth generation control transistor T113, a fourteenth generation control transistor T114, a fifteenth generation control transistor T115, a sixteenth generation control transistor T116, a seventeenth generation control transistor T117, a first capacitor C1, a second capacitor C2 and a third capacitor C3.

In FIG. 39, the one labeled I1 is the input terminal, the one labeled Q is the first node, the one labeled QB is the second node, the one labeled VGH is the high level terminal, and the one labeled CKA is the first clock signal terminal, the one labeled CKB is the second clock signal terminal, the one labeled VGL is the low level terminal, the one labeled TRST is the frame reset terminal, the one labeled CR is the carry signal output terminal, and the one labeled G(2n−1) is the (2n−1)th stage of driving output terminal, the one labeled G(2n) is the 2nth stage of driving output terminal; the input terminal is electrically connected to the carry signal output terminal of the adjacent previous stage of driving circuit.

The display device provided by the embodiments of the present disclosure may be any product or component with a display function, such as a mobile phone, a tablet computer, a television, a monitor, a notebook computer, a digital photo frame, a navigator, and the like.

The above descriptions are alternative implementations of the present disclosure. It should be pointed out that those skilled in the art can make some improvements and modifications without departing from the principle of the present disclosure. These improvements and modifications are also fall within the protection scope of the present disclosure.

What is claimed is:

1. A display substrate, comprising a base substrate and a driving module arranged on the base substrate, wherein the driving module includes at least one driving unit, and the driving unit includes N stages of driving circuits; N is a positive integer, n is a positive integer less than or equal to N;

an nth stage of driving circuit includes a (2n−1)th stage of output circuit, a 2nth stage of output circuit and a first node control circuit;

the first node control circuit is electrically connected to a first node and is configured to control a potential of the first node;

the (2n−1)th stage of output circuit is electrically connected to the first node and a (2n−1)th stage of driving output terminal, and is configured to control the (2n−

1)th stage of driving output terminal to provide a (2n−1)th stage of scanning signal under the control of the potential of the first node;

the 2nth stage of output circuit is electrically connected to the first node and a 2nth stage of driving output terminal respectively, and is configured to control the 2nth stage of driving output terminal to provide a 2nd stage of scanning signal under the control of the potential of the first node;

the first node is electrically connected to the (2n−1)th stage of output circuit and the 2nth stage of output circuit respectively through a first connection line;

the driving module further includes a scanning line;

there are at least two mutually independent overlapping portions between an orthographic projection of the first connection line on the base substrate and an orthographic projection of the scanning line on the base substrate;

wherein the driving module includes a shift register, a first driving unit, a second driving unit, a first scanning line, a second scanning line, and a shift scanning line; the first driving unit is electrically connected to the first scanning line and is configured to provide a first scanning signal for the first scanning line; the second driving unit is electrically connected to the second scanning line and is configured to provide a second scanning signal for the second scanning line; the shift register is electrically connected to the shift scanning line and is configured to provide a shift scanning signal for the shift scanning line;

the shift register, the first driving unit and the second driving unit are arranged in sequence along a direction close to a display area.

2. The display substrate according to claim 1, wherein the nth stage of driving circuit further includes a second node control circuit;

the second node control circuit is electrically connected to a second node and is configured to control a potential of the second node;

the (2n−1)th stage of output circuit is also electrically connected to the second node, and is also configured to control the (2n−1)th stage of driving output terminal to provide the (2n−1)th stage of scanning signal under the control of the potential of the second node;

the 2nth stage of output circuit is also electrically connected to the second node, and is further configured to control the 2nth stage of driving output terminal to provide the 2nth stage of scanning signal under the control of the potential of the second node;

the second node is electrically connected to the (2n−1)th stage of output circuit and the 2nth stage of output circuit through a second connection line; there are at least two mutually independent overlapping portions between an orthographic projection of the second connection line on the base substrate and the orthographic projection of the scanning line on the base substrate.

3. The display substrate according to claim 1, wherein the first connection line includes a first connection line part, a first conducting line, a second conducting line and a second connection line part;

the first node is electrically connected to the (2n−1)th stage of output circuit through the first connection line part, and the first connection line part is respectively electrically connected to the first conducting line and the second conducting line, and the first conducting line and the second conducting line are electrically connected to the 2nth stage of driving circuit through the second connection line part respectively;

there is a first overlapping portion between the orthographic projection of the scanning line on the base substrate and an orthographic projection of the first conducting line on the base substrate, there is a second overlapping portion between the orthographic projection of the scanning line on the base substrate and an orthographic projection of the second conducting line on the base substrate;

the first overlapping portion and the second overlapping portion are independent of each other, wherein a line width of the first conducting line is greater than or equal to 5 μm and less than or equal to 10 μm, and a line width of the second conducting line is greater than or equal to 5 μm and less than or equal to 10 um;

a distance between the first conducting line and the second conducting line is greater than or equal to 6 μm and less than or equal to 8 um.

4. The display substrate according to claim 2, wherein the second connection line includes a third connection line part, a third conducting line, a fourth conducting line and a fourth connection line part;

the second node is electrically connected to the 2nth stage of output circuit through the third connection line part, and the third connection line part is respectively electrically connected to the third conducting line and the fourth conducting line, and the third conducting line and the fourth conducting line are respectively electrically connected to the (2n−1)th stage of driving circuit through the fourth connection line part;

there is a third overlapping portion between the orthographic projection of the scanning line on the base substrate and an orthographic projection of the third conducting line on the base substrate, there is a fourth overlapping portion between the orthographic projection of the scanning line on the base substrate and an orthographic projection of the fourth conducting line on the base substrate;

the third overlapping portion and the fourth overlapping portion are independent of each other, wherein a line width of the third conducting line is greater than or equal to 5 μm and less than or equal to 10 μm, and a line width of the fourth conducting line is greater than or equal to 5 μm and less than or equal to 10 um;

a distance between the third conducting line and the fourth conducting line is greater than or equal to 6 μm and less than or equal to 8 um.

5. The display substrate according to claim 1, wherein the scanning line includes a first scanning connection line, a first scanning line part, a second scanning line part, and a second scanning connection line;

the first scanning connection line is electrically connected to the second scanning connection line through the first scanning line part and the second scanning line part;

there is a fifth overlapping portion between the orthographic projection of the first connection line on the base substrate and an orthographic projection of the first scanning line part on the base substrate, there is a sixth overlapping portion between the orthographic projection of the first connection line on the base substrate and an orthographic projection of the second scanning line part on the base substrate;

the fifth overlapping portion and the sixth overlapping portion are independent of each other, wherein a line width of the first scanning line part is greater than or equal to 5 μm and less than or equal to 10 μm, and a line width of the second scanning line part is greater than or equal to 5 μm and less than or equal to 10 um, a distance between the first scanning line part and the second scanning line part is greater than or equal to 6 μm and less than or equal to 8 um.

6. The display substrate according to claim 2, wherein the scanning line include a third scanning connection line, a third scanning line part, a fourth scanning line part and a fourth scanning connection line;

the third scanning connection line is electrically connected to the fourth scanning connection line through the third scanning line part and the fourth scanning line part, and there is a seventh overlapping portion between the orthographic projection of the second connection line on the base substrate and an orthographic projection of the third scanning line part on the base substrate, there is an eighth overlapping portion between the orthographic projection of the second connection line on the base substrate and an orthographic projection of the fourth scanning line part on the base substrate;

the seventh overlapping portion and the eighth overlapping portion are independent of each other, wherein a line width of the third scanning line part is greater than or equal to 5 μm and less than or equal to 10 μm, and a line width of the fourth scanning line part is greater than or equal to 5 μm and less than or equal to 10 um, a distance between the third scanning line part and the fourth scanning line part is greater than or equal to 6 μm and less than or equal to 8 um.

7. The display substrate according to claim 1, wherein the first driving unit includes a plurality of stages of first driving circuit;

an nth stage of first driving circuit includes a (2n−1)th stage of first output circuit, a 2nth stage of first output circuit, a first first node control circuit and a first second node control circuit;

the first first node control circuit is electrically connected to a first first node, and is configured to control a potential of the first first node;

the first second node control circuit is electrically connected to a first second node and is configured to control a potential of the first second node;

the (2n−1)th stage of first output circuit is electrically connected to the first first node, the first second node, and a (2n−1)th stage of first driving output terminal respectively, is configured to control the (2n−1)th stage of first driving output terminal to provide a (2n−1)th stage of first scanning signal under the control of the potential of the first first node and the potential of the first second node;

the 2nth stage of first output circuit is electrically connected to the first first node, the first second node, and the 2nth stage of first driving output terminal, respectively, is configured to control the 2nth stage of first driving output terminal to provide the 2nth stage of first scanning signal under the control of the potential of the first first node and the potential of the first second node;

the driving module further includes a first scanning line of a (2n−1)th row and a first scanning line of a 2nth row; the (2n−1)th stage of first driving output terminal is electrically connected to the first scanning line of the (2n−1)th row, the 2nth stage of the first driving output terminal is electrically connected to the first scanning line of the 2nth row;

the first first node is respectively electrically connected to the (2n−1)th stage of first output circuit and the 2nth stage of first output circuit through a first first connection line;

the first second node is respectively electrically connected to the (2n−1)th stage of first output circuit and the 2nth stage of first output circuit through the first second connection line;

there are at least two mutually independent overlapping portions between an orthographic projection of the first first connection line on the base substrate and an orthographic projection of the shift scanning line on the base substrate, there are at least two mutually independent overlapping portions between an orthographic projection of the first second connection line on the base substrate and the orthographic projection of the shift scanning line on the base substrate.

8. The display substrate according to claim 7, wherein the second driving unit includes a plurality of stages of second driving circuits;

an nth stage of second driving circuit includes a (2n−1)th stage of second output circuit, a 2nth stage of second output circuit, a second first node control circuit and a second second node control circuit;

the second first node control circuit is electrically connected to the second first node, and is configured to control the potential of the second first node;

the second second node control circuit is electrically connected to the second second node, and is configured to control the potential of the second second node;

the (2n−1)th stage of second output circuit is electrically connected to the second first node, the second second node, and the (2n−1)th stage of second driving output terminal respectively, is configured to control the (2n−1)th stage of second driving output terminal to provide a (2n−1)th stage of second scanning signal under the control of the potential of the second first node and the potential of the second second node;

the 2nth stage of second output circuit is electrically connected to the second first node, the second second node, and the 2nth stage of second driving output terminal, is configured to control the 2nth stage of second driving output terminal to provide a 2nth stage of second scanning signal under the control of the potential of the second first node and the potential of the second second node;

the driving module also includes a second scanning line of the (2n−1)th row and a second scanning line of the 2nth row; the (2n−1)th stage of second driving output terminal is electrically connected to the second scanning line of the (2n−1)th row, the 2nth stage of second driving output terminal is electrically connected to the second scanning line of the 2nth row;

the second first node is electrically connected to the (2n−1)th stage of second output circuit and the 2nth stage of second output circuit respectively through a second first connection line;

the second second node is respectively electrically connected to the (2n−1)th stage of second output circuit and the 2nth stage of second output circuit through a second second connection line;

there are at least two mutually independent overlapping portions between an orthographic projection of the second first connection line on the base substrate and the orthographic projection of the shift scanning line on the base substrate, there are at least two mutually independent overlapping portions between the orthographic projection of the second second connection line on the base substrate and the orthographic projection of the shift scanning line on the base substrate.

9. The display substrate according to claim 8, wherein there are at least two mutually independent overlapping portions between the orthographic projection of the second first connection line on the base substrate and the orthographic projection of the first scanning line of the (2n−1)th row on the base substrate; there are at least two mutually independent overlapping portions between the orthographic projection of the second second connection line on the base substrate and the orthographic projection of the first scanning line of the (2n−1)th row on the base substrate; or, there are at least two mutually independent overlapping portions between the orthographic projection of the second first connection line on the base substrate and the orthographic projection of the first scanning line of the 2nth row on the base substrate; there are at least two mutually independent overlapping portions between the orthographic projection of the second second connection line on the base substrate and the orthographic projection of the first scanning line of the 2nth row on the base substrate.

10. The display substrate according to claim 8, wherein the driving module further comprises a third scanning line and a third driving unit; the third driving unit is electrically connected to the third scanning line and is configured to provide a third scanning signal for the third scanning line;

the third driving unit is arranged on a side of the second driving unit close to the display area.

11. The display substrate according to claim 10, wherein the third driving unit includes a plurality of stages of third driving circuits;

the nth stage of third driving circuit includes a (2n−1)th stage of third output circuit, a 2nth stage of third output circuit, a third first node control circuit and a third second node control circuit;

the third first node control circuit is electrically connected to a third first node, and is configured to control a potential of the third first node;

the third second node control circuit is electrically connected to a third second node, and is configured to control a potential of the third second node;

the (2n−1)th stage of third output circuit is electrically connected to the third first node, the third second node and the (2n−1)th stage of third driving output terminal respectively, is configured to control the (2n−1)th stage of third driving output terminal to provide a (2n−1)th stage of third scanning signal under the control of the potential of the third first node and the potential of the third second node;

the 2nth stage of third output circuit is electrically connected to the third first node, the third second node, and the 2nth stage of third driving output terminal, and is configured to control the 2nth stage of third driving output terminal to provide a 2nth stage of third scanning signal under the control of the potential of the third first node and the potential of the third second node;

the driving module further includes a third scanning line of the (2n−1)th row and a third scanning line of the 2nth row; the (2n−1)th stage of the third driving output terminal is electrically connected to the third scanning line of the (2n−1)th row, the 2nth stage of third driving output terminal is electrically connected to the third scanning line of the 2nth row;

the third first node is respectively electrically connected to the (2n−1)th stage of third output circuit and the 2nth stage of third output circuit through a third first connection line;

the third second node is respectively electrically connected to the (2n−1)th stage of third output circuit and the 2nth stage of third output circuit through a third second connection line;

there are at least two mutually independent overlapping portions between an orthographic projection of the third first connection line on the base substrate and the orthographic projection of the shift scanning line on the base substrate, there are at least two mutually independent overlapping portions between an orthographic projection of the third second connection line on the base substrate and the orthographic projection of the shift scanning line on the base substrate.

12. The display substrate according to claim 11, wherein there are at least two mutually independent overlapping portions between the orthographic projection of the third first connection line on the base substrate and the orthographic projection of the first scanning line of (2n−1)th row on the base substrate; there are at least two mutually independent overlapping portions between the orthographic projection of the third second connection line on the base substrate and the orthographic projection of the first scanning line of (2n−1)th row on the base substrate; there are at least two mutually independent overlapping portions between the orthographic projection of the third first connection line on the base substrate and the orthographic projection of the second scanning line of (2n−1)th row on the base substrate; there are at least two mutually independent overlapping portions between the orthographic projection of the third second connection line on the base substrate and the orthographic projection of the second scanning line of the (2n−1)th row on the base substrate; or, there are at least two mutually independent overlapping portions between the orthographic projection of the third first connection line on the base substrate and the orthographic projection of the first scanning line of the 2nth row on the base substrate; there are at least two mutually independent overlapping portions between the orthographic projection of the third second connection line on the base substrate and the orthographic projection of the first scanning line of the 2nth row on the base substrate; there are at least two mutually independent overlapping portions between the orthographic projection of the third first connection line on the base substrate and the orthographic projection of the second scanning line of the 2nth row on the base substrate; there are at least two mutually independent overlapping portions between the orthographic projection of the third second connection line on the base substrate and the orthographic projection of the second scanning line of the 2nth row on the base substrate.

13. The display substrate according to claim 2, further comprising a first gate metal layer and a first source-drain metal layer arranged in sequence on the base substrate;

the scanning line included in the driving module is arranged on the first gate metal layer;

the first connection line includes a first conducting line and a second conducting line, and the second connection line includes a third conducting line and a fourth conducting line;

the first conducting line, the second conducting line, the third conducting line and the fourth conducting line are all arranged on the first source-drain metal layer.

14. The display substrate according to claim 2, further comprising a first gate metal layer, a first source-drain metal layer, and a second source-drain metal layer arranged in sequence on the base substrate;

the scanning line included in the driving module is arranged on the first gate metal layer;

the first connection line includes a first conducting line and a second conducting line, and the second connection line includes a third conducting line and a fourth conducting line;

the first conducting line, the second conducting line, the third conducting line and the fourth conducting line are all arranged on the second source-drain metal layer.

15. The display substrate according to claim 3, comprising a first gate metal layer, a first source-drain metal layer, and a second source-drain metal layer arranged in sequence on the base substrate;

the first conducting line is arranged on the first source-drain metal layer, the second conducting line is arranged on the second source-drain metal layer; or the first conducting line is arranged on the second source-drain metal layer, the second conducting line is arranged on the first source-drain metal layer.

16. The display substrate according to claim 4, comprising a first gate metal layer, a first source-drain metal layer, and a second source-drain metal layer arranged in sequence on the base substrate;

the third conducting line is arranged on the first source-drain metal layer, the fourth conducting line is arranged on the second source-drain metal layer; or the third conducting line is arranged on the second source-drain metal layer, the fourth conducting line is arranged on the first source-drain metal layer.

17. A maintenance method of a display substrate, applied to the display substrate according to claim 1, wherein the maintenance method comprises:

performing a screen-on test on the display substrate, and controlling each row of pixel circuits to display an image;

when there is an abnormal display of the pixel circuit, detecting, by a line detector, whether there is a short circuit between a scanning line of a corresponding row and a first connection line;

when the line detector detects the short circuit between the scanning line of the corresponding row and the first connection line, cutting off the scanning line of the corresponding row or the first connection line, so that the scanning line of the corresponding row is disconnected from the first connection line, and the scanning line of the corresponding row provides a scanning signal of the corresponding row to the corresponding row of pixel circuits, and the first connection line is electrically connected to the (2n−1)th stage of output circuit and the 2nth stage of output circuit.

18. The maintenance method according to claim 17, wherein, the nth stage of driving circuit further includes a second node control circuit; the (2n−1)th stage of output circuit is also electrically connected to the second node; the second node is electrically connected to the (2n−1)th stage of output circuit and the 2nth stage of output circuit through the second connection line; there are at least two independent overlapping portions between the orthographic projection of the second connection line on the base substrate and the orthographic projection of the scanning line on the base substrate; the maintenance method of the display substrate further includes:

when there is an abnormal display of the pixel circuit, detecting, by the line detector, whether there is a short circuit between the scanning line of the corresponding row and the second connection line;

when the line detector detects the short circuit between the scanning line of the corresponding row and the second connection line, cutting off the scanning line of the corresponding row or the second connection line, so that the scanning line of the corresponding row is disconnected from the second connection line, and the scanning line of the corresponding row provides a scanning signal of the corresponding row to the corresponding row of pixel circuits, and the second connection line is electrically connected to the (2n−1)th stage of output circuit and the 2nth stage of output circuit.

19. A display device comprising the display substrate according to claim 1.

* * * * *